US009043669B1

(12) United States Patent
Bruce et al.

(10) Patent No.: US 9,043,669 B1
(45) Date of Patent: May 26, 2015

(54) DISTRIBUTED ECC ENGINE FOR STORAGE MEDIA

(75) Inventors: Rey H. Bruce, San Jose, CA (US); Joey B. Climaco, Bislig (PH); Noeme P. Mateo, Pasig (PH)

(73) Assignee: BiTMICRO Networks, Inc., Fremont, CA (US)

( * ) Notice: Subject to any disclaimer, the term of this patent is extended or adjusted under 35 U.S.C. 154(b) by 312 days.

(21) Appl. No.: 13/475,878

(22) Filed: May 18, 2012

(51) Int. Cl.
H03M 13/00 (2006.01)
G11C 29/00 (2006.01)
H03M 13/27 (2006.01)
G06F 11/10 (2006.01)

(52) U.S. Cl.
CPC ............ *H03M 13/27* (2013.01); *G06F 11/1008* (2013.01)

(58) Field of Classification Search
CPC . G06F 11/1048; G06F 11/1008; H03M 13/27
USPC ......... 714/767, 769, 770, 772, 773, 757, 747, 714/751, 763, 764, 766, 799, 800, 801, 820, 714/701, 6.2, 6.21, 6.23, 6.24, 54, 52, 42; 365/200, 201; 711/111, 112
See application file for complete search history.

(56) References Cited

U.S. PATENT DOCUMENTS

| 4,752,871 A | 6/1988 | Sparks |
| 5,222,046 A | 6/1993 | Kreifels et al. |
| 5,297,148 A | 3/1994 | Harari et al. |
| 5,341,339 A | 8/1994 | Wells |
| 5,371,709 A | 12/1994 | Fisher et al. |
| 5,379,401 A | 1/1995 | Robinson et al. |
| 5,388,083 A | 2/1995 | Assar et al. |
| 5,396,468 A | 3/1995 | Harari et al. |
| 5,406,529 A | 4/1995 | Asano |
| 5,432,748 A | 7/1995 | Hsu et al. |
| 5,448,577 A | 9/1995 | Wells et al. |
| 5,459,850 A | 10/1995 | Clay et al. |
| 5,479,638 A | 12/1995 | Assar et al. |
| 5,485,595 A | 1/1996 | Assar et al. |

(Continued)

FOREIGN PATENT DOCUMENTS

| EP | 0 458 510 | 11/1991 |
| JP | 2005-309847 | 11/2005 |
| WO | WO 94/06210 | 3/1994 |

OTHER PUBLICATIONS

Notice of Allowability for U.S. Appl. No. 13/890,229 mailed on Feb. 20, 2014.

(Continued)

*Primary Examiner* — Christine Tu
(74) *Attorney, Agent, or Firm* — Stephen Uriarte

(57) ABSTRACT

Embodiments of the present invention relate to an apparatus, method, and/or sequence for a distributed ECC that may be used in a storage system. In another embodiment of the invention, an apparatus for handling distributed error correction code (ECC) operations, includes: a plurality of ECC engines configured to perform ECC operations in parallel on multiple data parts; the plurality of ECC engines distributed in parallel to receive some of the multiple data parts that are read from storage media devices and to receive some of the other multiple data parts that are to be written to the storage media devices; and the plurality of ECC engines configured to use respective ECC bytes corresponding to respective ones of the multiple data parts.

50 Claims, 15 Drawing Sheets

(56) References Cited

U.S. PATENT DOCUMENTS

| | | |
|---|---|---|
| 5,488,711 A | 1/1996 | Hewitt et al. |
| 5,500,826 A | 3/1996 | Hsu et al. |
| 5,509,134 A | 4/1996 | Fandrich et al. |
| 5,513,138 A | 4/1996 | Manabe et al. |
| 5,524,231 A | 6/1996 | Brown |
| 5,530,828 A | 6/1996 | Kaki et al. |
| 5,535,328 A | 7/1996 | Harari et al. |
| 5,535,356 A | 7/1996 | Kim et al. |
| 5,542,042 A | 7/1996 | Manson |
| 5,542,082 A | 7/1996 | Solhjell |
| 5,548,741 A | 8/1996 | Watanabe |
| 5,559,956 A | 9/1996 | Sukegawa |
| 5,568,423 A | 10/1996 | Jou et al. |
| 5,568,439 A | 10/1996 | Harari |
| 5,572,466 A | 11/1996 | Sukegawa |
| 5,594,883 A | 1/1997 | Pricer |
| 5,602,987 A | 2/1997 | Harari et al. |
| 5,603,001 A | 2/1997 | Sukegawa et al. |
| 5,606,529 A | 2/1997 | Honma et al. |
| 5,606,532 A | 2/1997 | Lambrache et al. |
| 5,619,470 A | 4/1997 | Fukumoto |
| 5,627,783 A | 5/1997 | Miyauchi |
| 5,640,349 A | 6/1997 | Kakinuma et al. |
| 5,644,784 A | 7/1997 | Peek |
| 5,737,742 A | 4/1998 | Achiwa et al. |
| 5,796,182 A | 8/1998 | Martin |
| 5,799,200 A | 8/1998 | Brant et al. |
| 5,802,554 A | 9/1998 | Caceres et al. |
| 5,819,307 A | 10/1998 | Iwamoto et al. |
| 5,822,251 A | 10/1998 | Bruce et al. |
| 5,875,351 A | 2/1999 | Riley |
| 5,881,264 A | 3/1999 | Kurosawa |
| 5,913,215 A | 6/1999 | Rubinstein et al. |
| 5,918,033 A | 6/1999 | Heeb et al. |
| 5,943,421 A | 8/1999 | Grabon |
| 6,000,006 A | 12/1999 | Bruce et al. |
| 6,076,137 A | 6/2000 | Asnaashari |
| 6,215,875 B1 | 4/2001 | Nohda |
| 6,230,269 B1 | 5/2001 | Spies et al. |
| 6,298,071 B1 | 10/2001 | Taylor et al. |
| 6,317,330 B1 | 11/2001 | Portman et al. |
| 6,363,441 B1 | 3/2002 | Bentz et al. |
| 6,363,444 B1 | 3/2002 | Platko et al. |
| 6,404,772 B1 | 6/2002 | Beach et al. |
| 6,526,506 B1 | 2/2003 | Lewis |
| 6,529,416 B2 | 3/2003 | Bruce et al. |
| 6,557,095 B1 | 4/2003 | Henstrom |
| 6,757,845 B2 | 6/2004 | Bruce |
| 6,857,076 B1 | 2/2005 | Klein |
| 6,901,499 B2 | 5/2005 | Aasheim et al. |
| 6,961,805 B2 | 11/2005 | Lakhani et al. |
| 6,970,446 B2 | 11/2005 | Krischer et al. |
| 6,970,890 B1 | 11/2005 | Bruce et al. |
| 6,980,795 B1 | 12/2005 | Hermann et al. |
| 7,103,684 B2 | 9/2006 | Chen et al. |
| 7,174,438 B2 | 2/2007 | Homma et al. |
| 7,194,766 B2 | 3/2007 | Noehring et al. |
| 7,263,006 B2 | 8/2007 | Aritome |
| 7,283,629 B2 | 10/2007 | Kaler et al. |
| 7,305,548 B2 | 12/2007 | Pierce et al. |
| 7,330,954 B2 | 2/2008 | Nangle |
| 7,372,962 B2 | 5/2008 | Fujimoto et al. |
| 7,500,063 B2 | 3/2009 | Zohar et al. |
| 7,506,098 B2 | 3/2009 | Arcedera et al. |
| 7,613,876 B2 | 11/2009 | Bruce et al. |
| 7,620,748 B1 | 11/2009 | Bruce et al. |
| 7,624,239 B2 | 11/2009 | Bennett et al. |
| 7,660,941 B2 | 2/2010 | Lee et al. |
| 7,716,389 B1 | 5/2010 | Bruce et al. |
| 7,729,370 B1 | 6/2010 | Orcine et al. |
| 7,743,202 B2 | 6/2010 | Tsai et al. |
| 7,765,359 B2 | 7/2010 | Kang et al. |
| 7,826,243 B2 | 11/2010 | Bruce et al. |
| 7,934,052 B2 | 4/2011 | Prins et al. |
| 8,010,740 B2 | 8/2011 | Arcedera et al. |
| 8,032,700 B2 | 10/2011 | Bruce et al. |
| 8,093,103 B2 | 1/2012 | Bruce et al. |
| 8,165,301 B1 | 4/2012 | Bruce et al. |
| 8,200,879 B1 | 6/2012 | Falik et al. |
| 8,375,257 B2 * | 2/2013 | Hong et al. ............ 714/52 |
| 8,447,908 B2 | 5/2013 | Bruce et al. |
| 8,510,631 B2 * | 8/2013 | Wu et al. ............ 714/764 |
| 8,560,804 B2 | 10/2013 | Bruce et al. |
| 8,707,134 B2 * | 4/2014 | Takahashi et al. ........ 714/763 |
| 8,713,417 B2 * | 4/2014 | Jo ............ 714/785 |
| 8,788,725 B2 | 7/2014 | Bruce et al. |
| 8,959,307 B1 | 2/2015 | Bruce et al. |
| 2001/0010066 A1 | 7/2001 | Chin et al. |
| 2002/0073324 A1 | 6/2002 | Hsu et al. |
| 2002/0083262 A1 | 6/2002 | Fukuzumi |
| 2002/0141244 A1 | 10/2002 | Bruce et al. |
| 2003/0163624 A1 | 8/2003 | Matsui et al. |
| 2003/0182576 A1 | 9/2003 | Morlang et al. |
| 2003/0204675 A1 | 10/2003 | Dover et al. |
| 2003/0223585 A1 | 12/2003 | Tardo et al. |
| 2004/0128553 A1 | 7/2004 | Buer et al. |
| 2006/0095709 A1 | 5/2006 | Achiwa |
| 2006/0184723 A1 | 8/2006 | Sinclair et al. |
| 2007/0019573 A1 | 1/2007 | Nishimura |
| 2007/0028040 A1 | 2/2007 | Sinclair |
| 2007/0083680 A1 | 4/2007 | King et al. |
| 2007/0130439 A1 | 6/2007 | Andersson et al. |
| 2007/0174493 A1 | 7/2007 | Irish et al. |
| 2007/0174506 A1 | 7/2007 | Tsuruta |
| 2007/0195957 A1 | 8/2007 | Arulambalam et al. |
| 2009/0094411 A1 | 4/2009 | Que |
| 2009/0158085 A1 | 6/2009 | Kern et al. |
| 2009/0172250 A1 | 7/2009 | Allen et al. |
| 2009/0172466 A1 | 7/2009 | Royer et al. |
| 2011/0113186 A1 | 5/2011 | Bruce et al. |
| 2011/0161568 A1 | 6/2011 | Bruce et al. |
| 2011/0167204 A1 | 7/2011 | Estakhri et al. |
| 2011/0202709 A1 | 8/2011 | Rychlik |
| 2011/0264884 A1 | 10/2011 | Kim |
| 2013/0246694 A1 | 9/2013 | Bruce et al. |

OTHER PUBLICATIONS

Office Action for U.S. Appl. No. 13/890,229 mailed on Oct. 8, 2013.
Office Action for U.S. Appl. No. 13/253,912 mailed on Jul. 16, 2014.
Office Action for U.S. Appl. No. 12/876,113 mailed on Jul. 11, 2014.
Office Action for U.S. Appl. No. 12/876,113 mailed on Oct. 16, 2014.
Notice of Allowance for U.S. Appl. No. 12/270,626 mailed Oct. 3, 2014.
Office Action for U.S. Appl. No. 12/270,626 mailed on May 23, 2014.
Office Action for U.S. Appl. No. 12/270,626 mailed on Dec. 18, 2013.
Office Action for U.S. Appl. No. 12/270,626 mailed on Mar. 15, 2013.
Office Action for U.S. Appl. No. 12/270,626 mailed on Aug. 23, 2012.
Office Action for U.S. Appl. No. 12/270,626 mailed on Feb. 3, 2012.
Office Action for U.S. Appl. No. 12/270,626 mailed on Apr. 4, 2011.
Office Action for U.S. Appl. No. 12/876,113 mailed on Mar. 13, 2014.
Advisory Action for U.S. Appl. No. 12/876,113 mailed on Sep. 6, 2013.
Office Action for U.S. Appl. No. 12/876,113 mailed on May 14, 2013.
Office Action for U.S. Appl. No. 12/876,113 mailed on Dec. 21, 2012.
Security Comes to SNMP: The New SNMPv3 Proposed Internet Standard, The Internet Protocol Journal, vol. 1, No. 3, Dec. 1998.
Notice of Allowability for U.S. Appl. No. 12/882,059 mailed on May 30, 2013.
Notice of Allowability for U.S. Appl. No. 12/882,059 mailed on Feb. 14, 2013.
Office Action for U.S. Appl. No. 12/882,059 mailed on May 11, 2012.
Notice of Allowance/Allowability for U.S. Appl. No. 14/038,684 mailed Dec. 5, 2014.
Notice of Allowance/Allowability for U.S. Appl. No. 14/038,684 mailed Aug. 1, 2014.

(56) References Cited

OTHER PUBLICATIONS

Office Action for U.S. Appl. No. 14/038,684 mailed on Mar. 17, 2014.
USPTO Notice of Allowability & attachment(s) mailed Jan. 7, 2013 for U.S. Appl. No. 12/876,247.
Office Action mailed Sep. 14, 2012 for U.S. Appl. No. 12/876,247.
Office Action mailed Feb. 1, 2012 for U.S. Appl. No. 12/876,247.
Notice of Allowance/Allowability for U.S. Appl. No. 12/270,626 mailed on Oct. 3, 2014.
Advisory Action for U.S. Appl. No. 12/876,113 mailed on Oct. 16, 2014.
Office Action for U.S. Appl. No. 13/253,912 mailed on Jan. 29, 2015.
Office Action for U.S. Appl. No. 12/876,113 mailed on Dec. 5, 2014.
Notice of Allowance/Allowability for U.S. Appl. No. 14/038,684 mailed on Mar. 26, 2015.

* cited by examiner

DMA Instruction Set

| Bits | Type | Field Name | Field Description |
|---|---|---|---|
| [31:6] | RW | DMA Fields | DMA Fields |
| [5:3] | RW | EccConf | ECC Configuration Number |
| [2:1] | RW | EccM | ECC Module Mode |
| [0] | RW | EccB | ECC Bypass Bit |

ECC Field Values

| Field Name | Bits | Value | Description | |
|---|---|---|---|---|
| ECC Configuration | 3 | 3'b000 | Up to 12 bytes ECC 6 byte correction | 405 |
| | | 3'b001 | Up to 6 bytes ECC 3 byte correction | 406 |
| | | 3'b010 | Up to 14 bytes ECC 6 byte correction | 407 |
| | | 3'b011 | Up to 9 bytes ECC 4 byte correction | 408 |
| | | 3'b100 | Up to 5 bytes ECC 2 byte correction | 409 |
| | | 3'b101 | Up to 8 bytes ECC 3 byte correction | 410 |
| | | 3'b110 | Up to 5 bytes ECC 2 byte correction | 411 |
| | | 3'b111 | Up to 3 bytes ECC 1 byte correction | 412 |
| ECC Module Mode | 2 | 2'b00 | Encode Mode | 413 |
| | | 2'b01 | Detect Only Mode | 414 |
| | | 2'b10 | Detect and Correct Mode | 415 |
| | | 2'b11 | Reserved | 416 |
| Ecc Bypass Bit | 1 | 1'b0 | Enable ECC Module | 417 |
| | | 1'b1 | Bypass ECC Module | 418 |

FIGURE 4

DISTRIBUTED ECC ENGINE FOR STORAGE MEDIA

BACKGROUND (1) Technical Field

The present invention relates to computer storage systems, such as data storage devices that use error correction code (ECC) engines.

(2) Description of Related Art

Maintaining the integrity of stored data is an important concern in any storage system and different methods have been developed over the years in attempts to address this concern. A popular method is computing an Error Correction Code (or ECC) for a set of data and appending the ECC to the data in storage. When the data is retrieved, the ECC can be recomputed as the data is being read and then checked against the stored ECC to detect errors on the data.

Additionally, algorithms have been developed so that error corrections can be subsequently performed on the erroneous data, where such algorithms use the computed ECC. While such algorithms for ECC encoding and/or ECC error detection and correction can be implemented using software or firmware programs, advancements in ASIC (application specific integrated circuit) processing technology have allowed the embedding of logic for ECC computations in hardware. Typically, using hardware ECC engines is favorable over software computations (for error detection and correction) because of the speed at which the computations can be performed in hardware.

However, ECC computations in storage systems may still provide a performance bottleneck. Some current hardware ECC implementations place an ECC engine in the main storage controller. The ECC engine may typically be a bottleneck to the data path especially if the storage system employs parallelism and/or if the storage system controls multiple storage devices because the ECC computation by the ECC engine is centralized in the data transfers in a single data path area.

Some current hardware ECC implementations embed the ECC engine on each of the storage devices in the storage system. While this approach may potentially eliminate the bottleneck in the data path, this approach may not be economical because an ECC engine (embedded in a corresponding storage device) is unused if that corresponding storage device is not being accessed and would also add to the storage media device logic.

Hence, there is a need for a novel approach that solves the deficiencies in current storage systems that use ECC engines. There is also a need to increase the speed of ECC computations in storage systems.

Additionally, there is a further need for a novel approach to distributing the ECC engines in a storage system such that the ECC computations will not affect the performance of the storage system. There is yet a further need for a novel approach to distributing the ECC engines in a storage system in an economical manner (or optimized manner) and/or that would not require specialized storage media devices with added logic for the ECC engines.

SUMMARY

Embodiments of the present invention relate to an apparatus, methods, and/or sequences for providing a distributed ECC (Error Correction Code) and distributed ECC engines for use in a storage system. Embodiments of the invention effectively and advantageously avoid the bottleneck for computing the ECC, and this bottleneck is avoided by distributing the ECC computation load to several ECC engines in the storage system.

Embodiments of the invention also provide an apparatus, methods, and/or sequences for distributing the ECC engines in a storage system in an economical manner (or optimized manner) and/or that would not require specialized storage media devices with added logic for the ECC engines.

In another embodiment of the invention, an apparatus includes multiple ECC engines with each ECC engine configured to handle ECC computations for a corresponding group of storage media devices.

In another embodiment of the invention, an apparatus for handling distributed error correction code (ECC) operations includes: a plurality of ECC engines configured to perform ECC operations in parallel on multiple data parts; the plurality of ECC engines distributed in parallel to receive some of the multiple data parts that are read from storage media devices and to receive some of the other multiple data parts that are to be written to the storage media devices; and the plurality of ECC engines configured to use respective ECC bytes corresponding to respective ones of the multiple data parts.

In another embodiment of the invention, a method for handling distributed error correction code (ECC) operations includes: performing ECC operations in parallel on multiple data parts; and the performing ECC operations including using respective ECC bytes corresponding to respective ones of the multiple data parts; some of the multiple data parts are read from storage media devices and some of the other multiple data parts are to be written to the storage media devices.

In yet another embodiment of the invention, an apparatus includes multiple ECC engines that are distributed in a storage DMA controller or in a plurality of storage interface controllers.

In yet another embodiment of the invention, an apparatus includes multiple ECC engines, wherein each ECC engine includes an ECC encoding and detection module in a storage interface controller and an ECC correct module in a storage DMA controller.

The above and additional advantages of the present invention will become apparent to those skilled in the art from a reading of the following detailed description when taken in conjunction with the accompanying drawings.

BRIEF DESCRIPTION OF THE DRAWINGS

FIG. 4 is a block diagram of a structure of DMA instructions with ECC configuration information, in accordance with an embodiment of the invention;

DETAILED DESCRIPTION OF THE INVENTION

Figure 1:
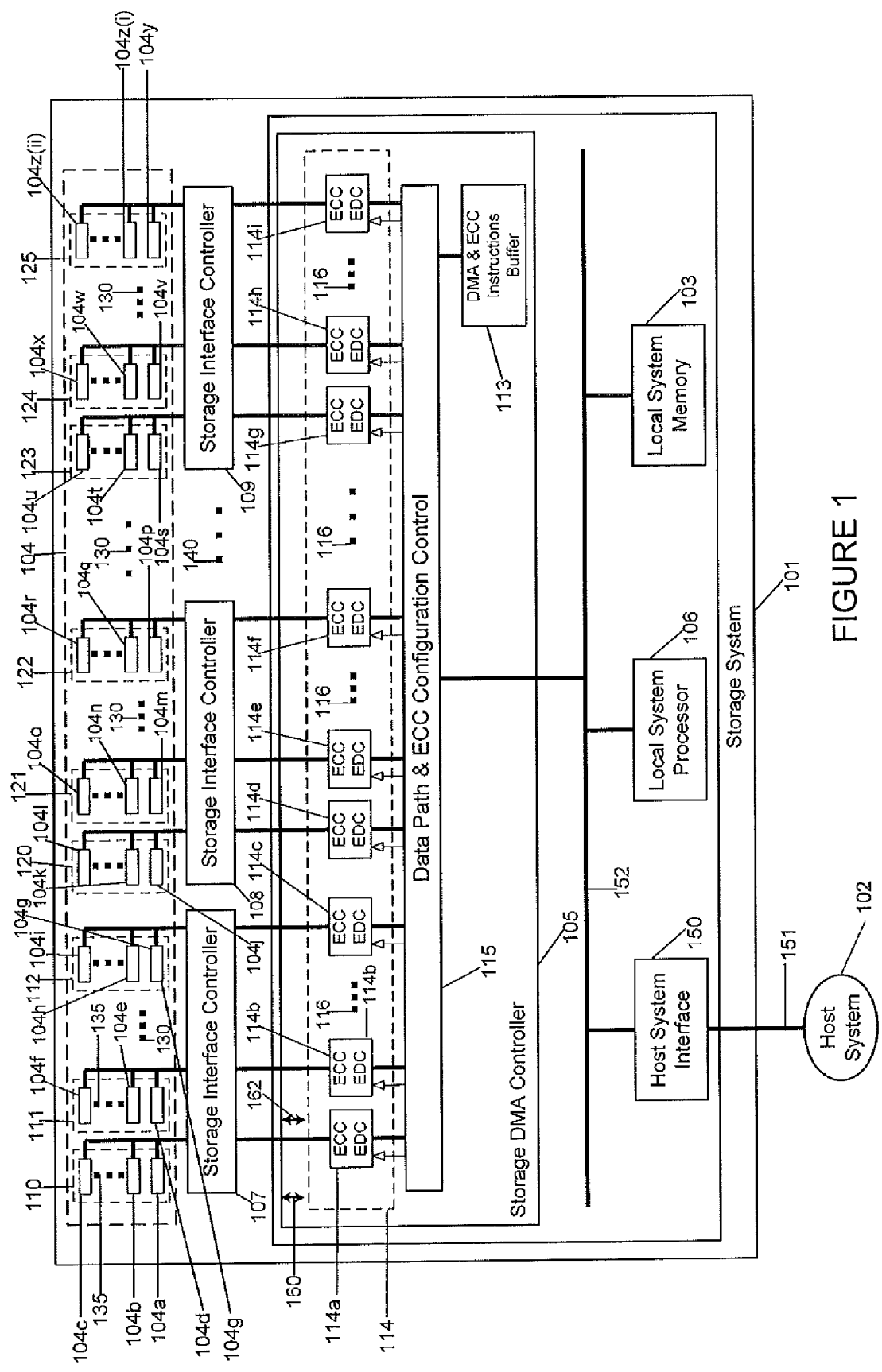
FIG. 1 is a block diagram of an example storage system that uses a storage DMA controller with distributed ECC capability, in accordance with one embodiment of the invention.

In the following detailed description, for purposes of explanation, numerous specific details are set forth to provide a thorough understanding of the various embodiments of the present invention. Those of ordinary skill in the art will realize that these various embodiments of the present invention are illustrative only and are not intended to be limiting in any way. Other embodiments of the present invention will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual implementation, numerous implementation-specific decisions may be required to achieve specific design objectives. These design objectives will vary from one implementation to another and from one developer to another. Moreover, it will be appreciated that such a development effort might be complex and time-consuming but would nevertheless be a routine engineering undertaking for those of ordinary skill in the art having the benefit of this disclosure.

Embodiments of the present invention relate to an apparatus, methods, and/or sequences for a distributed ECC (Error Correction Code) that may be used in a storage system. The approach presented in various embodiments is advantageous for storage systems that employ multiple data paths to the storage media in order to improve access rates.

An embodiment of the present invention also provides an apparatus including multiple ECC engines with each ECC engine handling ECC computations for a corresponding group of storage media devices. Embodiments of the invention effectively and advantageously avoid the bottleneck for computing the ECC, and this bottleneck is avoided by distributing the ECC computation load to several ECC engines in the storage system. Various methods and parameters for configuring the ECC engines will also be discussed below, in accordance with various embodiments of the invention.

In further embodiments of the invention, a storage system with distributed ECC capability is presented. In further embodiments of the invention, an apparatus includes a storage DMA controller that controls multiple storage media devices. The storage DMA controller performs DMA (direct memory access) between the storage media devices and the local system memory (e.g., DRAM or SRAM). The storage media devices are grouped such that all devices in a given group are accessed by using a single storage interface controller associated with that given group.

In another particular embodiment of the invention, a storage DMA controller and storage interface controllers include various combinations of features to permit distributed ECC capability, as will be discussed below. In yet another particular embodiment, multiple storage DMA controllers may also be coupled to storage interface controllers, in a chip set, to permit distributed ECC capability with increased computing capabilities, as will be discussed below. In yet another particular embodiment, an increased number of multiple storage interface controllers may be coupled to a decreased number of storage DMA controllers, in a chip set, to achieve a decreased sized and/or lower cost device.

FIG. 1 is a block diagram of an example storage system 101 that uses a storage DMA controller 105 with distributed ECC capability, in accordance with one embodiment of the invention. The storage system 101 is used by a host system 102 (i.e., host 102) for any particular storage application. The host system 102 can transmit read and write instructions to the storage system 101 via the host system interface 150 (i.e., host system interface controller 150) in the storage system 101. The host system 102 may, for example, be any computing device that can communicate with the host system interface 150, such as by sending the memory transaction requests and receiving the results of such memory transaction requests. The host system 102 may be in the form of a computer or its equivalents.

The system 101 also includes a local memory system 103 that serves as a temporary cache for data that is being read or written by the host system 102. By way of example and not by way of limitation, the local memory system 103 is typically a smaller-capacity memory device. Additionally, some of the elements or components in the storage system 101 can be varied or substituted in a manner that would achieve the functions or operations described herein.

The storage system 101 can be connected to a plurality of storage media devices 104 via the storage interface controllers 107, 108, and up to 109. The system 101 permanently stores and distributes the data to the several storage media devices 104 and also reads data stored in the devices 104. A storage media device 104 may be, for example, a non-volatile memory device such as, e.g., a flash memory device (or flash chip), an SDRAM, other types of DRAMs, or another suitable type of non-volatile memory device. The term "flash memory device" (or "flash chip") is intended to include any form of non-volatile solid-state memory, including those that use blocks of non-volatile memory cells, named flash blocks. Each memory cell (not shown) may be single or multi-level. Flash memory devices are known by those of ordinary skill in the art. A flash memory device permits memory operations, such as a write or read operation, to be performed on these flash blocks according to a protocol supported by the flash memory device. A flash memory device may be implemented by using a NAND flash memory device that complies with the Open NAND Flash Interface Specification, commonly referred to as ONFI Specification. The term "ONFI Specification" is a known device interface standard created by a consortium of technology companies, called the "ONFI Workgroup". The ONFI Workgroup develops open standards for NAND flash memory devices and for devices that communicate with these NAND flash memory devices. The ONFI Workgroup is headquartered in Hillsboro, Oreg. Using a flash memory device that complies with the ONFI Specification is not intended to limit the embodiment disclosed. One of ordinary skill in the art having the benefit of this disclosure would readily recognize that other types of flash memory devices employing different device interface protocols may be used, such as protocols compatible with the standards created through the Non-Volatile Memory Host Controller Interface ("NVMHCI") working group. Members of the NVMHCI working group include Intel Corporation of Santa Clara, Calif., Dell Inc. of Round Rock, Tex., and Microsoft Corporation of Redmond, Wash.

Each storage media device 104 (and associated circuitry) may also include various standard elements such as, for example, a flash memory buffer circuit (which can be coupled to a storage interface controller) and/or other hardware components, and their general interaction within the storage device 101 are not described to avoid overcomplicating the herein disclosure.

The host system 102 may also be coupled to the host system interface 150 by use of additional standard elements operating with a peripheral interface, such as, e.g., SCSI, Fibre Channel, ATA, IDE, and/or the like, for permitting the host system 102 to perform storage operations on the storage system 101, such as write and read operations. The conduit between the host system 102 and the host system interface controller 150 is shown in a simplified representation of a bus line 151 and may include switches, routers, and network devices but are not shown to avoid complicating the herein disclosure. For example, if the interface controller 150 is implemented using a fibre channel interface, then at least one port provided by a switch would be part of the conduit between the host system interface controller 150 and the host system 102.

The storage system 101 also includes a local system processor 106 that can control several storage media devices 104 that are concurrently using the storage DMA controller 105. The local system processor 106 uses uniform structures called DMA instructions for programming DMA (direct memory access) operations. The local system processor 106 (and associated circuitry) may include various standard elements such as, for example, a processor circuit, a local processor memory, and/or a ROM, and their general interaction within the storage device 101 are not described to avoid overcomplicating the herein disclosure.

A local system bus 152 may be used to permit communications between and among the host system interface controller 150, local system processor 106, local system memory 103, storage DMA controller 105, and/or other components in the system 101.

In an embodiment, the system 101 includes and uses the storage DMA controller 105 with distributed ECC capability to control the storage media devices 104. The local system processor 106 may also run the software code (and/or firmware code) that manages the storage system 101 and that processes the requests from the host system 102. Depending on the access requests (e.g., read request or write request), the local system processor 106 will dynamically program the storage DMA controller 105 to perform DMA operations between the storage media devices 104 and the local system memory 103.

The storage DMA controller 105 has one or more (or a set of) DMA & ECC instruction buffers 113 configured to store DMA instructions for use in DMA operations and ECC configurations for use in ECC operations described herein. The storage DMA controller 105 and storage interface controllers 107-109 may both be included in a chip set or may be in separate chips. The storage DMA controller 105 can perform concurrent DMA operations, with one DMA operation for each of the groups of storage media devices 104 connected via the storage interface controllers 107-109 that are used as interface chips. The DMA instruction (e.g., DMA instruction set 450 in FIG. 4) contains the ECC configuration(s) 404 for the ECC computations on the data.

The storage DMA controller 105 can be programmed to perform a DMA write (DMA operation) with distributed ECC from the local system memory 103 to the storage media devices 104. For this WRITE operation, the data block 160 to be transferred will first be partitioned as will be described additionally with reference to FIG. 3. Each partition will be assigned to be written to a different storage media device 104. The participating storage media devices 104 will each belong to a respective different group in the devices 104. A different ECC EDC module (or ECC ED module in some embodiments) is assigned to perform the computation of ECC bytes for the write data in a distributed manner and/or parallel manner as will be discussed below. The local system processor 106 runs a storage management program 350 (FIG. 3) that determines the partition of the write data and that creates a DMA instruction for the data transfer and ECC configuration for each partition. A respective ECC engine 114 also computes respective ECC bytes 162 for a respective data part (partition) in the data block 160. The storage management program 350 may be programmed by use of standard programming languages (e.g., C++ or other suitable programming languages) and by use of standard programming techniques known to those skilled in the relevant art(s).

The storage DMA controller 105 can also be programmed to perform a DMA read (DMA operation) with distributed ECC from the storage media devices 104 to the local system memory 103. For this operation, the storage media devices 104 containing the data partitions that make up the read data 160 are determined by the storage management program 350 (FIG. 3) running on the local system processor 106. The read data are in participating storage media devices that belong to different groups in devices 104. A different ECC EDC module (or ECC ED module and ECC Correct module in some embodiments) is assigned to perform the ECC error detection (or ECC error detection and ECC error correction in another embodiment) based on the detected ECC bytes of the read data, and the ECC error detection (or the ECC error detection and ECC error correction in another embodiment) on the multiple data parts are performed in a distributed manner and/or parallel manner as will be discussed below. A respective ECC engine 114 detects for an ECC error in a respective data part based on respective ECC bytes 162 for that respective data part in the data block 160. In other embodiments, the respective ECC engine 114 can also perform ECC correction on that respective data part if an ECC error is detected for that respective data part. The local system processor 106 runs the program 350 (FIG. 3) that determines the partitions in the data block 160 and creates a DMA instruction for the data transfer and ECC configuration for each partition.

As noted above, the storage media devices 104 are divided into groups of storage media devices 104. In the example configuration in FIG. 1, the storage media devices 104 are divided into (or allocated among) the groups 110, 111, 112, 120, 121, 122, 123, 124, and up to 125 of storage media devices. The dot symbols 130 indicate that the number of groups of storage media devices 104 may vary. Therefore, the devices 104 can contain more (or can contain less) than the example groups 110, 111, 112, 120, 121, 122, 123, 124, and up to 125.

The dot symbols 135 indicate that the number of storage media devices 104 in a given group may vary. As an example, the group 110 may include the storage media devices 104a, 104b, and up to 104c, may include less than the devices 104a-104c, or may include more than the devices 104a-104c. Other dot symbols are shown in other drawings herein and indicate that the components associated with the dot symbols may vary in number.

As noted above, the system 101 may be coupled, via the plurality of storage interface controllers 107, 108, and up to 109, to the storage media devices 104. The dot symbols 140 indicate that the number of storage interface controllers in the system 101 may vary to any suitable number. As an example, the system 101 may include the storage interface controllers 107, 108, and up to 109, may include less than the controllers 107-109, or may include more than the controllers 107-109.

A single storage interface controller is used to access all storage media devices 104 in one group. By way of example and not by way of limitation, the controller 107 is configured to access the devices 104a-104c included in the group 110. The controller 107 is also configured to access the devices 104d-104f included in the group 111 and/or the devices 104g-104i included in the group 112. The controller 107 can be configured to access other amount(s) of groups of storage media devices 104. For example, the controller 107 can access one or more groups in addition to the groups 110-112, or can access less than all of the groups 110-112.

In one embodiment, the storage interface controllers 107-109 may be implemented as independent chips. Each storage interface controller directly controls one or more groups of storage media devices 104 and provides a path for the data blocks 160 and the distributed ECC bytes 162 (associated with the data blocks 160) from any of the storage media devices 104 in a group (via one or more storage interface controllers 107-109) to the storage DMA controller 105, and vice versa. The storage DMA controller 105 is configured to provide these parallel connections to the multiple storage interface controllers 107-109, and as a result, the DMA controller 105 distributes the access paths to the storage media devices 104.

For additional clarity, additional non-limiting examples of the configurations of the groups of storage media devices 104 are summarized according to the following. For example, the controller 108 is configured to access the devices 104j-104l included in the group 120. The controller 108 is also configured to access the devices 104m-104o included in the group 121 and/or the devices 104p-104r included in the group 122. The controller 108 can be configured to also access other numbers of groups of storage media devices 104. For example, the controller 108 can access one or more groups in addition to the groups 120-122, or can access less than all of the groups 120-122.

For additional clarity, additional non-limiting examples of the configurations of the groups of storage media devices 104 are summarized according to the following. For example, the controller 109 is configured to access the devices 104s-104u included in the group 123. The controller 109 is also configured to access the devices 104v-104x included in the group 124 and/or the devices 104y, 104z(i), and 104z(ii) included in the group 125. The controller 109 can be configured to also access other amount(s) of groups of storage media devices 104. For example, the controller 109 can access one or more groups in addition to the groups 123-125, or can access less than all of the groups 123-125. As noted above, the number storage interface controllers can be more or can be less than the three controllers 107, 108, and 109.

In an embodiment, each storage interface controller (e.g., controller 107, 108, and 109) includes the logic to directly control one or more groups of storage media devices 104 and provides the parallel paths for data blocks 160 bytes and ECC bytes 162 (associated with the data blocks 160) from any of the storage media devices 104 in a given group to the storage DMA controller 105, and vice versa. Thus, the parallel paths distribute the access to the storage media devices 104 and avoid the data bottleneck problems of conventional approaches. The local system processor 106 in the storage system 101 can control several storage media devices 104 concurrently using the storage DMA controller 105. The local processor 106 uses the uniform structures called DMA instructions for programming DMA operations.

In an embodiment, any of the storage interface controllers 107, 108, and up to 109 may be, for example, a memory controller such as, a DMA controller, a toggle flash type controller, or another suitable type of storage interface controller. Therefore, the controllers 107-109 may be any controller with an interface (and that communicates) to any type of suitable storage device or memory.

As noted above, the storage DMA controller 105 includes one or more buffers 113 for storing DMA instructions for each of the storage interface controllers (e.g., controllers 107-109). The storage DMA controller 105 can perform concurrent DMA operations, with one DMA operation for each of the storage media device groups (e.g., groups 110-112) connected via a storage interface controller. For example, the storage DMA controller 105 performs a DMA operation for each of the groups 110, 111, and up to 112 connected via the storage interface controller 107 and concurrently performs DMA operations for each of the groups 120, 121, and up to 122 connected via the storage interface controller 108 and DMA operations for each of the groups 123, 124, and up to 125 connected via the storage interface controller 109. The DMA instructions also contain the configuration for ECC computations on the data, as discussed in further details with reference to FIG. 4.

In one embodiment of the invention, the storage DMA controller 105 includes multiple ECC Encode and Detect and Correct modules 114 (i.e., ECC EDC modules 114) that perform ECC computations in hardware in parallel. In accordance with one embodiment of the invention, the ECC EDC modules 114 are placed in or integrated with the storage DMA controller 105, in a distributed configuration as shown in FIG. 1. The ECC EDC modules 114 perform the ECC encode, ECC detect, and ECC correct operations that are known to those skilled in the relevant art(s). In the example of FIG. 1, the ECC EDC modules 114 include a plurality of ECC EDC modules 114a, 114b, and up to 114i. The ECC EDC modules 114 or 114a-114i are also referred herein as "ECC engines" 114 or 114a-114i. The dot symbols 116 indicate that the number of individual modules 114 may vary to any suitable number. As an example, the distributed ECC engines 114 may include the modules 114a-114i, may include less than the modules 114a-114i, or may include more than the modules 114a-114i. In the embodiment of the storage system 101 of FIG. 1, the ECC EDC modules 114a, 114b, and up to 114i are external to each of the storage interface controllers 107, 108, and up 109 and are included in (or integrated with) the storage DMA controller 105.

An ECC EDC module 114 operates in either the ECC Encode mode or the ECC Detect mode, or the ECC Detect and Correct mode. In the ECC Encode mode, the ECC EDC module 114 computes for the ECC bytes that are given by the data bytes as an input and the ECC bytes are then encoded with the data bytes. In the ECC Detect mode, the ECC EDC module 114 detects for an error that are given by the data bytes and the ECC bytes as an input. In the ECC Detect and Correct mode, the ECC EDC module 114 performs an error correction in hardware if an ECC error is detected during the ECC Detect mode. In the arrangement where the storage system 101 can concurrently perform multiple ECC computations, a contiguous data block 160 in the local system memory 103 that is to be stored in the storage media devices 104 will be partitioned into multiple data parts (see FIG. 3) so that a separate respective ECC EDC module 114 will compute a respective ECC for a respective data part, as will be shown in the examples in FIG. 3.

In a first embodiment, both a respective data part and the computed ECC bytes for that respective data part will pass through one of the storage interface controllers 107-109 to the destination storage media devices 104. In contrast, in a second embodiment as shown in FIG. 2, a respective data part and the ECC configuration for the computation of the respective data part will pass through one of the storage interface controllers 107-109 and the ECC bytes are also computed in or detected in the controllers 107-109.

In the storage DMA controller 105, the data path and ECC configuration control module 115 contains the logic that interprets the DMA instructions 403 (FIG. 4) in a DMA instruction set 450 and translates these DMA instructions into control signals for enabling the data to pass through to (or from) the storage interface controllers 107-109 (i.e., DMA operations) with distributed ECC. This control module 115 also translates the ECC configuration portion 404 (FIG. 4) of the DMA instructions set 450 into control signals for configuring the ECC EDC module 114 to operate on the passing data (i.e., ECC operations). The data path to the storage interface controllers 107-109 and the connected ECC EDC module 114 (associated with controllers 107-109) operate independently of other data paths and their associated connected ECC EDC modules 114. Therefore, multiple DMA with ECC computations can be occurring in parallel (and in a distributed manner) in the storage system 101 and the bottleneck problems of conventional approaches are reduced or eliminated.

Based on the foregoing, in a first embodiment of the invention, the storage DMA controller 105 has multiple ECC Encode modules, ECC Detect modules, and ECC Correct modules (i.e., ECC EDC modules 114) that perform the ECC computations in hardware. Therefore, the storage system permits multiple DMA with ECC computations, with the multiple DMA and ECC computations occurring in parallel. In a second embodiment of the invention as discussed with reference to FIG. 2, the ECC EDC modules 202 are placed in (or included within) the storage interface controllers.

Figure 2:
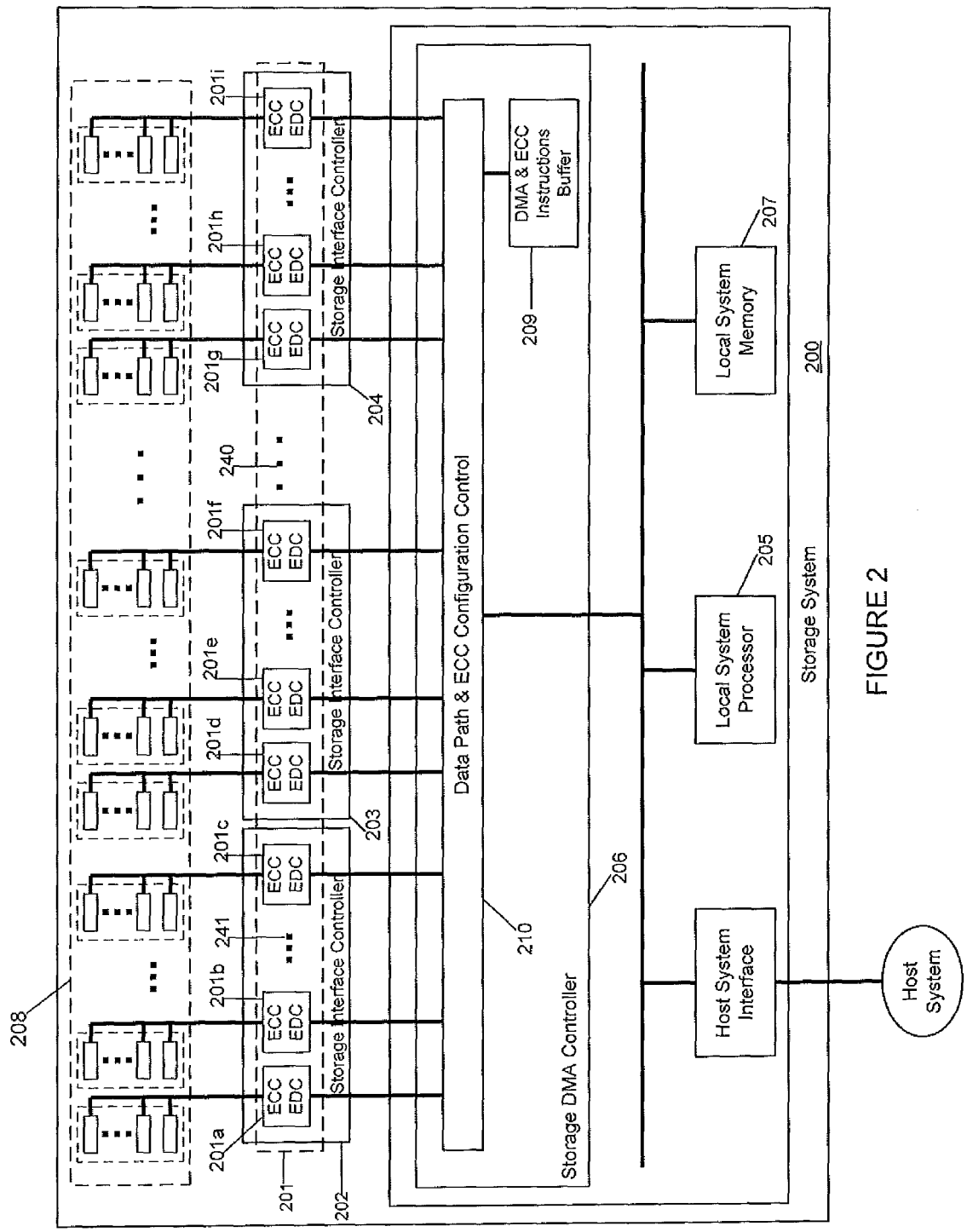
FIG. 2 is a block diagram of an example storage system with distributed ECC capability that is incorporated (or integrated) into the storage interface controllers that directly connect to a storage media, in accordance with another embodiment of the invention.

FIG. 2 is a block diagram of an example storage system 200 with distributed ECC capability that is incorporated (or integrated) into the storage interface controllers 202, 203, and up to 204 that directly connect to a storage media device(s) 208, in accordance with another embodiment of the invention. This second embodiment of the invention functions in the same manner as explained above for the first embodiment in FIG. 1 except for the different placement of the ECC EDC modules (i.e., ECC engines). In the embodiment shown in FIG. 2, the ECC EDC modules (or ECC engines) 201 (e.g., ECC EDC modules or ECC engines 201a, 202b, and up to 202i) are distributed within (and among) the storage interface controllers 202, 203, and up to 204 and are also external to the storage DMA controller 206. The storage system 200 would include the controller 206 as similarly discussed in FIG. 1 and would be coupled to the plurality of storage interface controllers 202, 203, and up to 204 as similarly discussed in other drawings herein.

As similarly discussed above, the plurality of storage interface controllers 202, 203, and up to 204 are coupled to (and communicates with) the storage media devices 208. The dot symbols 240 and 241 indicate that the number of storage interface controllers 202-204 and modules 201, respectively, may vary to any suitable number. The other similar components described in FIG. 1 may also vary in number in FIG. 2 and other applicable drawings.

As similarly discussed above, the local system processor 205 programs the storage DMA controller 206 to perform DMA operations between the local system memory 207 and the storage media devices 208 with distributed ECC in parallel operations. Likewise, the DMA instructions are stored in the DMA and ECC instruction buffer 209 included in the storage media controller 206. In this second embodiment of the storage system, the data path and ECC configuration control module 210 is configured to pass data bytes and the ECC control bytes (ECC configuration 404) that are used for configuring the connected ECC EDC modules 201. The ECC EDC modules 201 use the ECC control bytes to configure the ECC computations on the passing data bytes. The FCC control bytes are sent through the data path before sending the associated data of the ECC control bytes through the data path. During the DCC detect mode (or during the ECC detect and ECC correct mode), the result of the ECC operation is also passed through the data path as control bytes prior to passing the data bytes through the data path.

Figure 3:
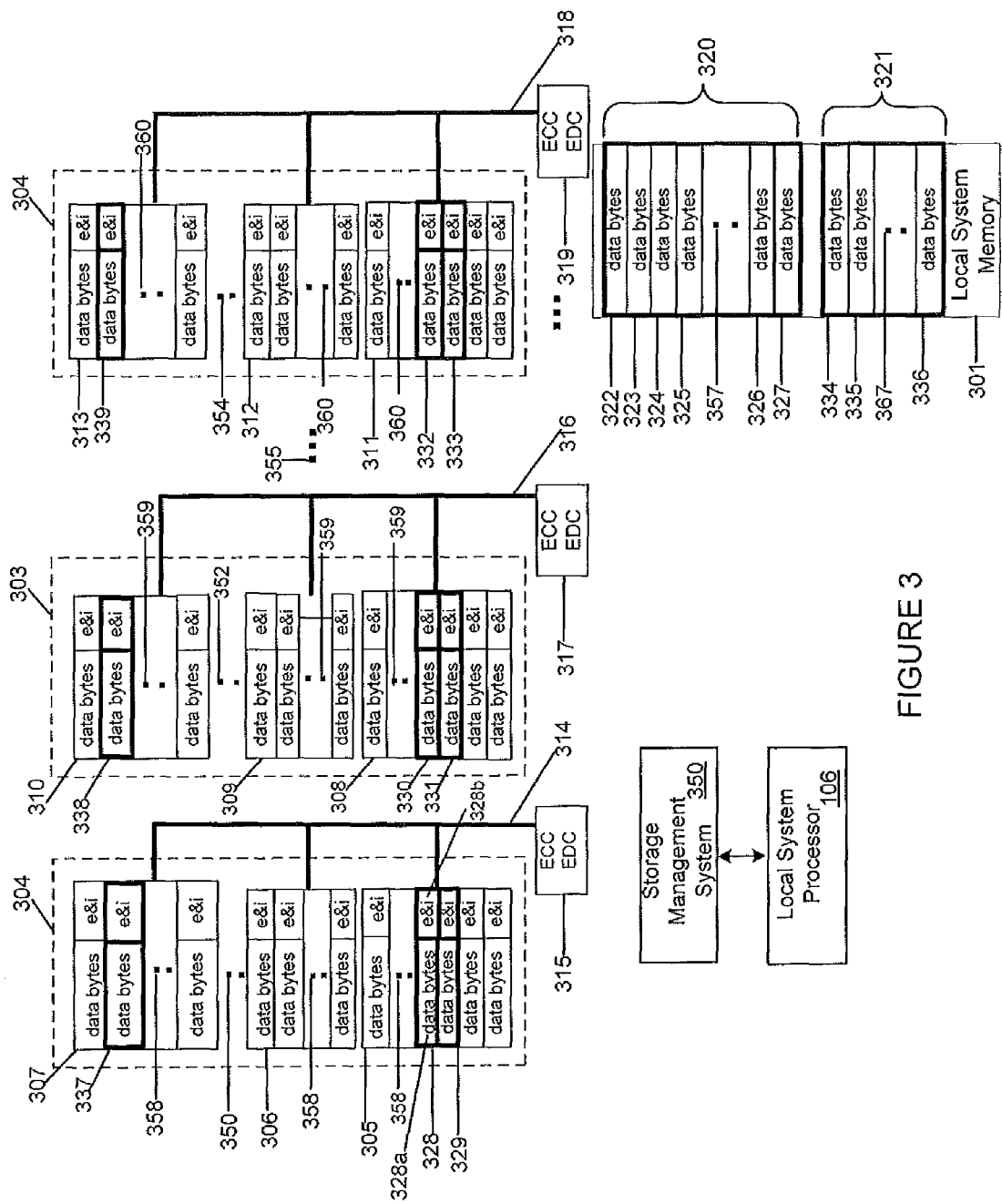
FIG. 3 is a block diagram of an example arrangement of data cached in the local system memory and distributed to the multiple storage media devices and stored as data units with accompanying ECC bytes, in accordance with an embodiment of the invention.

FIG. 3 is a block diagram of an example arrangement of data cached in the local system memory (e.g., memory 103, 207, 703, or 803) and distributed to the multiple storage media devices 104, and stored as data units with accompanying ECC bytes, in accordance with an embodiment of the invention. To avoid overcomplicating the herein disclosure, the components described with references to FIG. 3 and subsequent Figures may be the components shown in FIG. 1 (e.g., local system processor 106). However, these described components may also be the other similar components shown in the other drawings such as, for example, the similar components shown in FIGS. 2, 7, 8, 9, 10, 11, 12, and 13), but are not specifically identified as such components for purposes of brevity.

In each storage media device 104, the storage capacity is divided into storage units that can store a certain fixed amount of data. For each data unit allocation (e.g., allocation 328), additional bytes of storage are further allocated to store ECC bytes 162 (e.g., included in the e&i part 328*b*) along with other information for the corresponding data block 160 (e.g., included in data bytes 328*a*).

A data byte 328*a* (i.e., data unit 328*a* or data part 328*a*) may have a size of, for example, about 1024 bytes (or 8192 bits). This example size of a data byte 328*a* is not intended to be limiting, and may be any suitable size. Each of the other data bytes discussed herein may also have this same example size. As will also be discussed in a particular example below, the data byte 328*a* corresponds to the data byte 322 when the data byte 322 is stored in a storage media device 305.

An ECC code 162 (FIG. 1) in an e&i part 328*b* may have a size of, for example, about 16 bytes (or 128 bits). This example size of an ECC code 162 is not intended to be limiting, and may be any suitable size. Each of the other ECC codes (corresponding to other respective data bytes) discussed herein may also have this same example size.

A storage management program 350 (running on or executed by the local storage system processor 106) will dynamically determine the distribution and mapping of data 160 to be stored in the memory storage devices 104. Since the storage DMA controller 105 is typically not configured to determine the mapping of the data to be written to the devices 104, the program 350 is configured to determine the mapping and resulting data arrangement of the data to be transferred from the host system 102 via local system memory 301 and to the groups 302, 303, and up to 304 of devices 104. FIG. 3 illustrates an example of a resulting data arrangement facilitated by the program 350.

In the embodiments of the present invention where multiple ECC computations can be concurrently performed by the ECC engines 315, 317, and up to 319, contiguous data blocks (in the local system memory 103 and to be stored in the storage media devices 104) can be partitioned by the program 350 so that a separate ECC EDC module (e.g., separate ECC module 114*a* in FIG. 1) will compute the ECC for a corresponding data part.

In an embodiment of the invention, the local system memory 301 (also shown as local system memory 103 in FIG. 1) caches the data scheduled to be transferred to permanent storage with data protection using ECC. As earlier explained, the storage media devices 104 (serving as a permanent storage) are grouped such that all devices 104 in a given group are assigned a separate data path and a given ECC EDC module 104. In the embodiment shown in FIG. 3, the first storage media device group 302 includes multiple storage media devices 305, 306, and up to 307. The group 302 may have the same features as any of the groups 110-125 in FIG. 1. The dot symbols 350 indicate that the number of devices in a group 302 may vary. Therefore, there can be more devices in addition to the devices 305-307 or there can be less devices than the devices 305-307 in the group 302. The storage media devices 305-307 in this group 302 are assigned a separate data path 314 for the reading and writing of data and a separate ECC and EDC module 315 associated with the path 314 and group 302.

The second storage media device group 303 includes multiple storage media devices 308, 309, and up to 310. The dot symbols 352 indicate that the number of devices in the group 303 may vary. The storage media devices 308-310 in this group 303 are assigned a separate data path 316 for the reading and writing of data and a separate ECC and EDC module 317. The same configuration for all other storage media device groups are applicable in the devices 104 (FIG. 1), up to the last storage media device group 304 that includes the multiple storage media devices 311, 312, and up to 313. The dot symbols 354 indicate that the number of devices in the group 304 may vary. The storage media devices 311, 312, and up to 313 in this group 304 are also assigned a separate data path 118 for the reading and writing of data and a separate ECC and EDC module 319. The dot symbols 355 indicate that the number of groups in the devices 104 may vary and the number of ECC engines in FIG. 3 may also vary.

In each storage media device (e.g., devices 305-307), the storage capacity of the device is divided into storage units (data unit allocations) that can store a certain fixed amount of data. For each data unit allocation, additional bytes of storage are allocated to store ECC bytes along with other information (e.g., metadata) for the corresponding data unit to be associated with the stored ECC byte(s). In the embodiment shown in FIG. 3, the fixed data unit allocations are labeled "data bytes" and the additional bytes for ECC and other information are labeled "e&i". For example, the data unit allocation 328 includes the data bytes 328*a* which contain a given data part stored in the device 305 and e&i part 328*b* that is associated with the data bytes 328*a*. The e&i part 328*b* includes the computed ECC byte 162 (FIG. 1) for the data bytes 328*a* and metadata information for the data bytes 328*a*, where metadata information may be, for example, configuration of the ECC EDC module 315 such as the ECC type, amount of bits in the data bytes 328*a*, access amount and/or modification amount on the data bytes 328*a*, control block information or status (e.g., if the block with data bytes 328*a* is a free or used block), information related to the physical memory location of the data byte 328*a*, another ECC-related information, another non-ECC-related information, and/or another metadata.

As an example, the local system memory 301 stores a contiguous block of cached data 320 scheduled for transfer to permanent storage in groups 302-304. In another location in the memory 301, a memory range 321 is allocated for a block of data to be retrieved from permanent storage as will be discussed. The sizes of the data 320 and the data to be stored in the memory range 321 may be of any suitable size.

To take advantage of the multiple data paths (e.g., paths 314, 316, and 318) and multiple ECC EDC modules (e.g., modules 315, 317, and 319), the program 350 partitions the contiguous data 320 and 321 into multiple data units. For example, the data 320 is partitioned into multiple data units (i.e., multiple data parts) 322, 323, 324, 325, and up to 326 and 327. The dot symbols 357 indicate that the number of data units in the data 320 may vary to any suitable number of data unit partitions.

As an example, the data path and ECC configuration control block 115 (FIG. 1) will perform the following data transmissions. In a write operation, the block 115 transfers the multiple data units (data parts) 322 and 323 to the data unit allocations (data parts) 328 and 329, respectively, in the storage media device 305, and the multiple data units 322 and 323 are transferred to the device 305 by use of the data path 314 and ECC EDC module 315. As also shown in FIG. 4, the dot symbols 358, 359, and 360 indicate that the number of data unit allocations in storage media devices in groups 302, 303, and 304, respectively, may vary. Similarly, in this example, the block 115 transfers the multiple data units (data parts) 324 and 325 to the data unit allocations (data parts) 330 and 331, respectively, in the storage media device 308, and the multiple data units 324 and 325 are transferred to the device 308 by use of the data path 316 and ECC EDC module 317. This data allocation and transfer scheme continues until the block 115 has transferred the last two data units in the data block 320, namely, multiple data units 326 and 327 in this example, to the data allocations 332 and 333, respectively, in the storage media device 311, and the multiple data units 332 and 333 are transferred to the device 311 by use of the data path 318 and ECC EDC module 319. Therefore, the transfer of the data parts of data block 320, and the ECC operations on the data parts, are distributed among the paths 314, 316, and 318 and the corresponding ECC engines 315, 317, and 319.

In the same manner discussed above, the program 350 partitions the data (to be subsequently cached in the location 321) into multiple data units 334, 335, and up to 336. Location 321 will also herein referred to as data block 321 for convenience. The dot symbols 362 indicate that the number of data units (data parts) in the data block 321 may vary to any suitable number of data unit partitions. In a read operation, the control block 115 (FIG. 1) transfers the data unit (data part) 334 from the data unit allocation (data part) 337 (in storage media device 307) to the local system memory 301. The control block 115 transfers the data unit 334 by use of the data path 314 and ECC EDC module 315. The control block 115 also transfers the data unit (data part) 335 from the data unit allocation (data part) 338 (in storage media device 310) to the local system memory 301. The control block 115 transfers the data unit 335 by use of the data path 316 and ECC EDC module 317. This data partition and data transfer scheme continues up to the data unit 336 to be transferred (by the control block 115) from the data unit allocation 339 (in the storage media device 313) to the local system memory 301. The control block 115 transfers the data unit 336 by use of the data path 318 and ECC EDC module 319. Therefore, the transfer of the data parts of data block 321 (and the ECC operations on the data parts) are also distributed among paths 314, 316, and 318 and corresponding ECC engines 315, 317, and 319.

The multiple data parts transfers discussed with reference to FIG. 3 (e.g., multiple data parts 322-327 written from memory 301 to respective ones in the groups 302-304 and multiple data parts 334-336 read from respective ones in the groups 302-304), and the ECC operations relating to the multiple data parts, are performed in parallel paths and in a parallel, a distributed, and/or a concurrent manner.

The calculation of ECC and the storage interface itself for some media devices are typically bottlenecks to data transfer. However, in accordance with various embodiments of the invention, the storage systems disclosed herein (e.g., systems 101 or 200) can avoid this bottleneck problem since multiple parallel data transfers via separate (and parallel) data paths and multiple ECC calculations (by use of the separate and parallel ECC EDC modules 315, 317, and 319) can occur concurrently if the source storage media devices (for read operations) or destination storage media devices (for write operations) belong to different groups as shown in the example groups 302, 303, and 304. Also, the ECC EDC modules 315, 317, and 319 can be independently configured so that ECC encode operations can be performed concurrently with ECC detect and/or correct operations.

The distributed memory mapping of data (e.g., data 320 and data to be stored in memory range 321), as shown in FIG. 3, improves and optimizes the handling of ECC-related functions. The DMA transfer instructions, for example, benefit from this distributed memory mapping of data. As will be discussed below in FIGS. 7 and 8, for example, the DMA transfer instructions can now be executed in parallel such that ECC computations are distributed to several ECC engines, the data path bottleneck in previous ECC engines are advantageously eliminated or reduced, and the access rates to the storage media devices are improved.

FIG. 4 is a block diagram of an example structure of DMA instructions 450 (i.e., DMA instructions frame) with ECC configuration information, in accordance with an embodiment of the invention. Since the ECC modules (e.g., modules 315, 317, and 319) are distributed across a wide array of memory blocks, DMA handling no longer has to address the task of routing data into a single ECC module of standard systems. Also shown are example ECC Field Values 452 which are part of the ECC-related instructions 404 in the DMA instruction set 450. The use of the DMA Instruction set 450 with ECC Field Values 452 in a storage system in accordance with an embodiment of the invention will also be discussed below with reference to various Figures/drawings herein. Additionally, the various fields and bit values and descriptions in the example DMA instruction set 450 and example ECC Field Values 452 may be varied and are not intended to be limiting.

The DMA Instruction Set 450 forms the DMA instruction set of a storage system (e.g., system 101). In an embodiment, the DMA Instruction Set 450 includes generic DMA transfer Instructions 403 and the ECC-related instructions 404 that are easily appended to the DMA-related Instructions 403. The ECC field values 452 in the instructions 404 include the ECC Bypass bit settings 400, ECC Module Mode settings 401, and ECC configuration settings 402 which are now discussed.

The ECC Bypass Bit 400 is the ECC Module enable bit that can enable or disable an ECC engine (ECC module). When Bit 400 is set to HIGH as in the field 418, the Bit 400 shuts the ECC module off and will allow the data to pass through without ECC computations performed to the data. When the Bit 400 is set to LOW as in the field 417, the Bit 400 enables the ECC module, and depending on the ECC configuration settings given in the fields 402, the ECC module executes the ECC configuration settings based operations on the data on the fly. These different operations will also be discussed in further detail below with reference to the WRITE operations and READ operations in FIGS. 5 and 6, respectively.

The ECC Module Modes 401 are instructions that will set the function mode of the ECC module. The Encode Mode 413 is set as an ECC Module Mode by setting the example value 2'b0. Data that is transmitted to the ECC Module is encoded with ECC during this ECC Encode Mode, depending on the configuration values given in the field names 402.

The other ECC Module Mode instructions sets 401 are: (1) the ECC Detect Only Mode 414, which is a mode where the ECC module just detects the presence of errors in a data block; and (2) the ECC Detect and ECC Correct Mode 415, which is a mode where the ECC module detects the presence of ECC data block errors and executes an ECC error correction sequence after an error is detected. The modes 415 and 416 can be set as an ECC Module Mode by setting the example values 2"b01 and 2'b10, respectively. Both commands to set the mode 415 and 416 also depend on values in the ECC Configuration parameter 402.

In one embodiment, one or more additional modes can optionally be included in the Modes 401 by use of the reserve parameter 416 which can be set by the example value 2'b11.

As discussed in the previous paragraphs, embodiments of the invention perform memory allocation in storage systems including providing the mapping of pure data and also for other information such as ECC data and other system-related data (e.g., metadata). Some conventional storage systems rely on the ECC data and other system-related data for purposes of data integrity and system management. Embodiments of the invention distribute the ECC addresses to provide the current need for speed in the processing of data, and achieve increased data processing speed by the parallel and distributed processing of data as discussed above. An embodiment of the invention further provides configurations on the ECC modules that advantageously allow for more flexibility in handling extra memory space needed for system-related information and maintaining ECC capabilities.

In an embodiment of the invention, the ECC Configuration settings 402 provides eight (8) configurations for handling ECC bytes that allow a choice (or balancing) between data integrity and extra memory for system use. However, the number of configurations in the settings 402 may be varied and are not intended to be limiting. A typical storage system provides sixteen (16) bytes of extra memory space for ECC and other information. The computations in ECC Configuration settings 402 are typically based on that typical estimate of extra memory space. For example, ECC configuration 405 (as set by value 3'b000) uses up to approximately 12 bytes for ECC which can perform correction of approximately 6 bytes of data, and if used in a typical setting, the extra bytes available for the storage system for other use would be approximately 4 bytes (i.e., 16 bytes minus 12 bytes).

The other ECC Configuration settings 406, 407, 408, 409, 410, 411, and 412 also list the other ECC bytes (values) along with the number of byte corrections (of data) permitted by the corresponding ECC bytes. For example, ECC Configurations 406, 407, and 407 permits the ECC module to use up to approximately 6 bytes for ECC to correct approximately 3 bytes of data, approximately 14 bytes for ECC to correct approximately 6 bytes of data, and approximately 9 bytes for ECC to correct approximately 4 bytes of data, respectively. The parameters 405-412 may be programmed to other values or otherwise adjusted as desired by the user. These ECC byte values are based on a pre-computed table using a typical pure data block of approximate 512 bytes with the extra 16 bytes for ECC use and/or system use.

Figure 5:
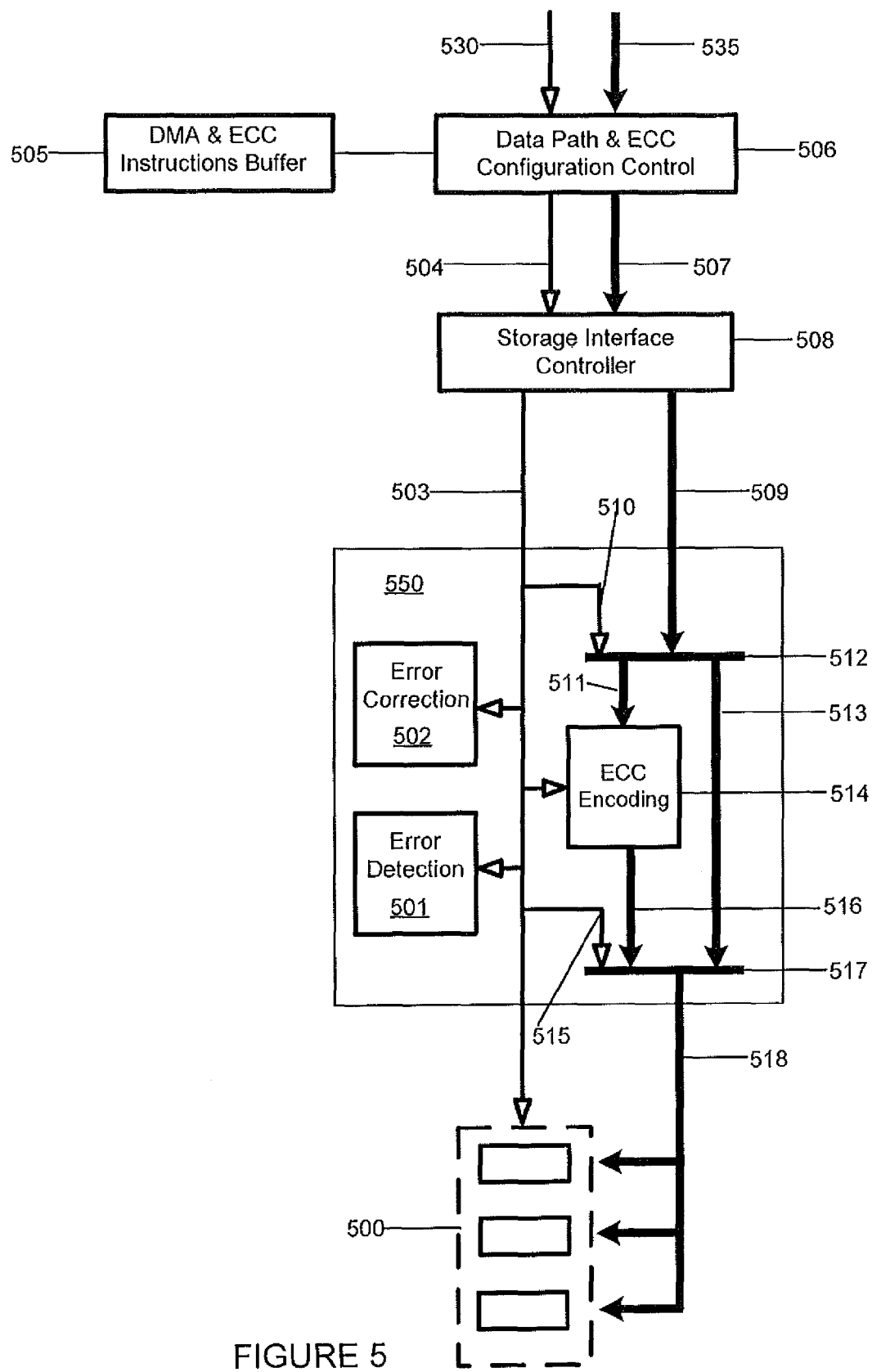
FIG. 5 is a block diagram of a data flow to the different ECC computation modules during a DMA write with ECC encode operation, in accordance with an embodiment of the invention.

FIG. 5 is a block diagram of a data flow of a WRITE instruction in a storage system according to an embodiment of the invention. Particularly, FIG. 5 shows a data flow to the different ECC computation modules during a DMA write with ECC encode operation (in one example), in accordance with an embodiment of the invention. The dark lines (e.g., lines 507, 509, 511, 513, 516, and 518) represent the data path, while the light lines (e.g., lines 503, 504, 510, and 515) represent the control signals.

The Data Path & ECC Configuration Control block 506 (which is also shown as Data Path & Configuration Control block 115 in FIG. 1) will receive the WRITE instruction 530 (and data 535 to be written to storage devices 500) from the host system 102 and will also hold or buffer the data to be written. The block 506 will pass the write instruction 530 and data 535, to the storage interface controller 508 (e.g., one of the controllers 107-109 in FIG. 1).

Prior to the execution of the write (or read) instructions, the ECC configurations 404 (FIG. 4) are already stored in the DMA & Instruction buffer 505 (also shown as buffer 113 in FIG. 1) or in block 506. Thus, the buffer 505 can store the DMA instruction set 450 with the ECC configurations 404 with the ECC field values 452. The Data Path & ECC Configuration Control block 506 processes these instructions 450 and passes these instructions 450 (which include the write instruction and ECC configurations 404) along the path 504 to the Storage Interface Controller 508.

The Storage Interface Controller 508 converts the instructions 450 into control signals as generally illustrated by control signals 503. As this example involves a WRITE instruction execution in the storage system 101, the control signals 503 will disable (turn off) the Error Detection module 501 and Error Correction module 502. Since a WRITE instruction is being executed in the storage system 101, the control signals 503 will also enable (turn on) the ECC Encoding module 514. In a write execution where the Bypass ECC Bit 400 (FIG. 4) is set to HIGH (i.e., set HIGH during the mode when the ECC encoding module 514 will not ECC encode the write execution data), the ECC configurations 404 in the control signals 510 and 515 will cause the multiplexers 512 and 517, respectively, to route the data (along paths 507, 509, 513, and 518) directly to the storage media devices 500 (also shown as devices 104 in FIG. 1) as a non-encoded data in response to the WRITE instruction.

In contrast, in a write execution with ECC Encoding to be applied to the data, the Bypass ECC Bit 400 is set to LOW, and the ECC Module Mode 401 (FIG. 4) is set to the Encode Mode 413. With the Encode Mode 413 being set, the multiplexer 512 receives the ECC configurations 404 in the control signal 510 from the storage interface controller 508 and will route the data (along line 509) to the ECC Encoding module 514 (along line 511). The module 514 performs data processing by BCC-encoding the data associated with the write instruction. The ECC Encoding module 514 obtains the details of the ECC Configuration 402 (FIG. 4) from the control signal 503. The ECC module mode 401 in the control signal 515 from storage interface controller 508 will control the multiplexer 517 to output the processed data 516 (which is the data 511 processed or ECC-encoded by the module 514) as an output processed data 518. The multiplexer 517 then routes this processed data 518 for storage to the storage media devices 500 in response to the WRITE instruction 530.

It is also noted that FIG. 5 shows only one example of the placement of an ECC EDC module 550 (i.e., ECC engine or ECC computation engine 550). FIG. 5 would be similar to the storage system 200 in FIG. 2 or storage system 1000 in FIG. 10, where the ECC computation by the ECC computation module 550 occurs during (or after) the storage interface controller 508 has received and processed the WRITE instructions and data to be written to devices 500. However, in another embodiment, the ECC computation module 550 may also be placed between the block 506 and the storage interface controller 508 as similarly illustrated by ECC computation modules 114 in FIG. 1.

Figure 6:
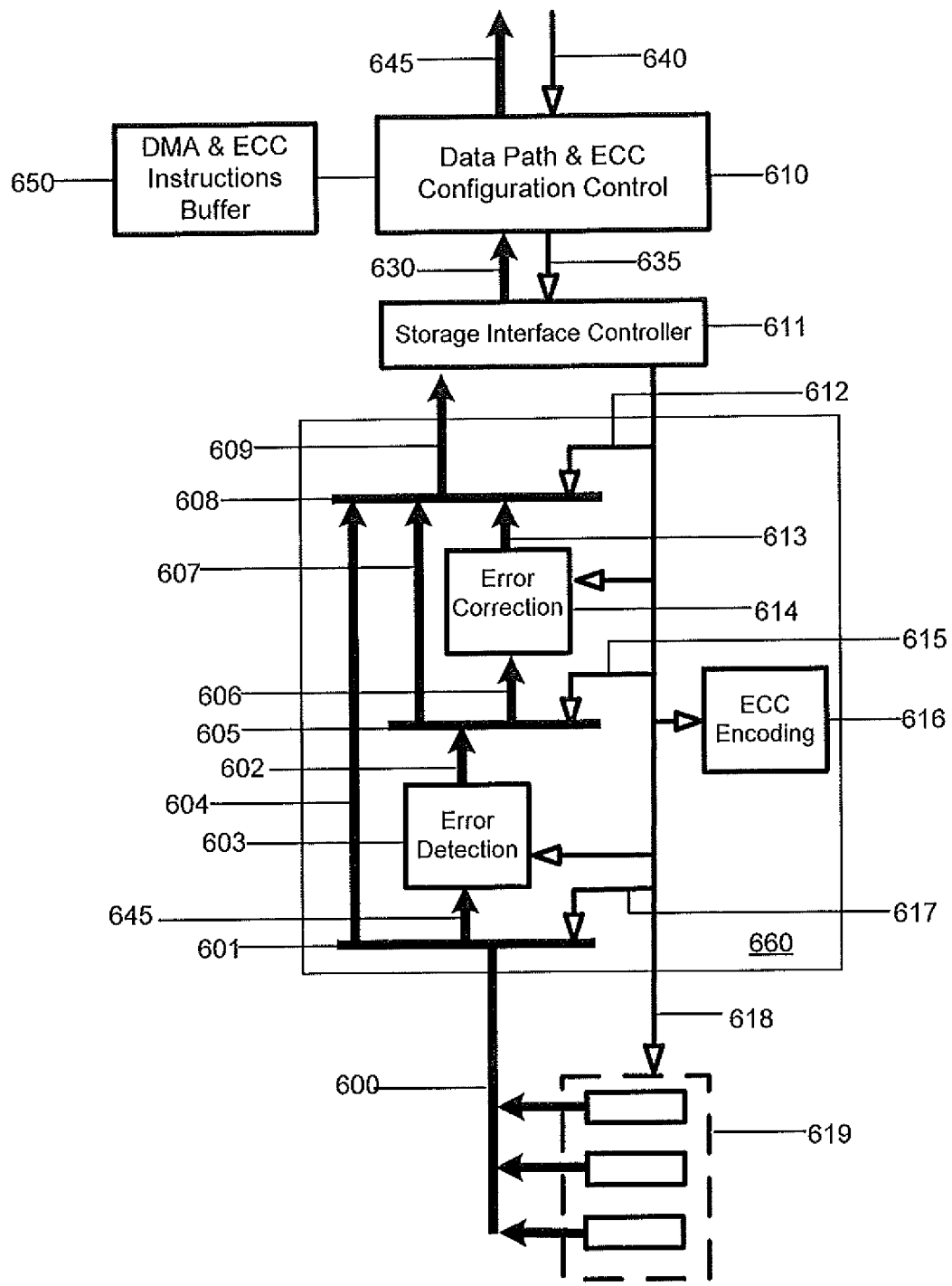
FIG. 6 is a block diagram of a data flow to the different ECC computation modules during a DMA read with ECC error detect operation and/or correct operation, in accordance with an embodiment of the invention.

FIG. 6 is a block diagram of a data flow of a READ instruction, in accordance with an embodiment of the invention. Particularly, FIG. 6 shows a data flow to the different ECC computation modules during a DMA read with ECC error detect operation and/or ECC correct operation, in accordance with an embodiment of the invention. The dark lines (e.g., lines 600, 602, 604, 607, 609, 613, and 630) represent the data path, while the light lines (e.g., lines 612, 615, 617, 618, and 635) represent the control signals. The host system 102 transmits the READ instruction 640 to the Data Path & ECC Configuration Control block 610 (which can be the same as block 115 or 506) and the block 610 passes the READ instruction (along path 635) to the Storage Interface Controller 611 (which can be the same as any of the blocks 107-109 or 508). The READ instruction runs through the control line 618 and reaches the storage devices 619 (which can be the same as devices 104 or 500) where data is read in response to the READ instruction 640. Since this is a READ operation, the ECC encoding block 616 (which can be the same as block 514 in FIG. 5) is disabled, as an ECC encoding block is only used during writes.

The data read from the storage media devices 619 passes (via line 600) to through the multiplexer 601 where the data will be accordingly routed depending on the ECC configurations 404 handed to the control signal 617 by the storage interface controller 611. The ECC configurations 404 are obtained from the buffer 650 or block 610. For example, in a READ instruction where the Bypass ECC Bit 400 (FIG. 4) is set to HIGH, the ECC configuration 404 along the control signal 617 will cause the multiplexer 601 to route the data from the path 600 to path 604 and the ECC configuration 404 along the control signal 612 will cause the multiplexer 608 to route the data from the path 604 to the path 609 directly to the Storage Interface Controller 611 without ECC computations on the data. The Storage Interface Controller 611 then transmits the data along path 630 to the block 610 which then transmits the data along the path 645 to the host system 102.

In contrast, in a READ instruction where the Bypass ECC Bit 400 is set to LOW, the ECC configuration 404 along the control signal 617 will cause the multiplexer 601 to route the data from the path 600 to path 645 and to the Error Detection module 603 which performs ECC error detection on the fly to the data.

If the ECC Module Mode 401 (FIG. 4) is set to the Detect Only Mode 414, then the data from the devices 619 is transmitted as follows. The ECC configuration 404 along the control signal 617 will cause the multiplexer 601 to route the data from the path 600 to the path 645 and through the error detection module 603 and to the path 602. The module 603 will detect for errors in the data from the devices 619. The ECC configuration 404 along the control signal 615 will cause the multiplexer 605 to route the data from the path 602 to the path 607, and the ECC configuration 404 along the control signal 612 will cause the multiplexer 608 to route the data from the path 607 to the path 609 and through the Storage Interface Controller 611. The Controller 611 then transmits the data along the path 630 and the block 610 transmits the data along the path 645 to the host system 102.

If the ECC Module Mode 401 (FIG. 4) is set to the Detect and Correct Mode 415, then the data from the devices 619 is transmitted as follows. The ECC configuration 404 along the control signal 617 will cause the multiplexer 601 to route the data from the path 600 to the path 645 and through the error detection module 603 and to the path 602. The module 603 will detect for errors in the data from the devices 619 as mentioned above. The ECC configuration 404 along the control signal 615 will cause the multiplexer 605 to route the data from the path 602 to the path 606 and through the error correction module 614 and along the path 613. The module 614 will perform ECC error correction on the data from the devices 619. Subsequently, the ECC configuration 404 along the control signal 612 will cause the multiplexer 608 to route the data from the path 613 to the path 609 and through the Storage Interface Controller 611. The Controller 611 then transmits the data along the path 630 and the block 610 transmits the data along the path 645 to the host system 102. The ECC error detection operation by the module 603 and the ECC error correction operation by the module 614 rely on the configuration parameters given in the ECC Configuration 404 with ECC configuration parameters 402 (FIG. 4) which can be stored in the buffer 650 (also shown as buffer 113 in FIG. 1) or in the control block 610.

The ECC computation module 660 is similar to the ECC computation module 550 in FIG. 5 and may also be placed between the block 610 and the storage interface controller 611 as similarly illustrated by ECC computation modules 114 in FIG. 1. The ECC computation module 660 is also referred herein as an ECC engine 660 or ECC computation engine 660.

Figure 7:
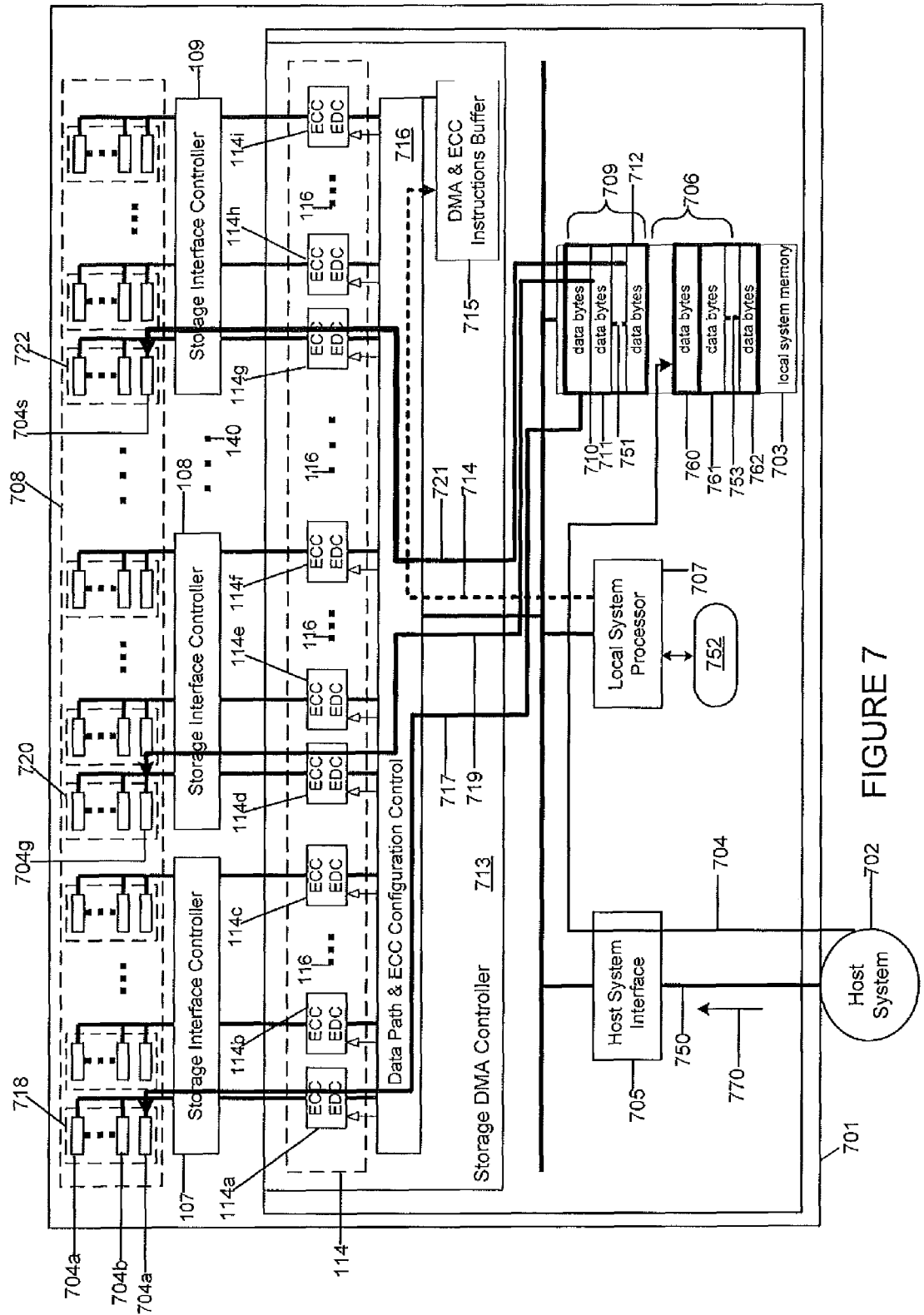
FIG. 7 is a block diagram of a data flow when servicing a typical write command from the host system connected to the storage system, in accordance with an embodiment of the invention.

FIG. 7 is a block diagram of a data flow when servicing a typical write command 770 from the host system 702 connected to the storage system 701, in accordance with an embodiment of the invention. The system 701 uses a first embodiment of the invention as an example illustration of the data flow, where the ECC EDC modules 114 are placed in or integrated with the storage DMA controller 713. However, this data flow in FIG. 7 may be applicable in other embodiments of the invention, since various embodiments of the invention vary only in the placement of the ECC computation modules. The various elements in FIG. 7 are similar to the corresponding elements in FIG. 1 (e.g., devices 708 in FIG. 7 corresponds to devices 104 in FIG. 1). In the shown example scenario, the storage system 701 is responding to a WRITE command from the connected host system 702.

The storage system 701 includes the local system memory 703 that is typically implemented by a volatile random access memory such as, for example, an SRAM or DRAM device, or implemented by another suitable device. Hence, data can be received faster from the host system 702 if the data were to be first stored in the local system memory 703 instead of the non-volatile storage media devices 708. In FIG. 7, the data flow arrow 704 shows the path of the write data 704 from the host system 702 to the local system memory 703. The host system interface controller 705 receives the write data 704 from the host interface bus 750 and then stores the write data 704 in a predetermined location 706 in the local system memory 703.

The local system processor 707 is running a storage management program (shown as a block 752 and stored in a memory such as a memory in the processor 707) that implements a caching algorithm and determines the location 706 and configures the host system interface controller 705 to store the data 704 to that location 706. Typical caching algorithms require that the data blocks in a cache will be flushed to their permanent storage location if the data in the cache is updated or in order to make room in the cache for other incoming write data 704.

Since the storage system 701 employs data protection using ECC, the local system processor 707 will have to set the ECC computation configuration parameters 452 for any data that will get flushed (i.e., transmitted and then stored) to permanent locations in the storage media devices 708 (i.e., write data cached in the local system memory 703 and subsequently stored in the storage media devices 708). In FIG. 7, the data in the location 709 (in memory 703) will be flushed to permanent locations in the storage media devices 708.

Since the storage system 701 has distributed ECC capability based on the distributed ECC EDC modules 114a, 114b, and up to 114i and distributed storage interface controllers 107, 108, and up to 109, the bottleneck of ECC bytes encoding is advantageously eliminated by partitioning the data into multiple data parts and then using the different ECC computation modules 114a-114i for computing the ECC bytes of each data part of the data flushed from the location 709. The data in location 709 is partitioned into example multiple data parts 710, 711, up to 712. The dots 751 indicate that the number of multiple data parts 710-712 may vary in a location.

The local system processor 707 controls the storage DMA controller 713 using DMA instructions 450 which can be stored in the buffers 715. As discussed earlier and illustrated in FIG. 4, the DMA instructions 450 can include DMA information 403 and also ECC configuration information 404. The dashed line arrow 714 in FIG. 7 illustrates the path of the DMA instructions 450 from the local system processor 707 to the DMA & ECC instructions buffer 715 which will store the DMA instructions 450.

The DMA instructions 450 in the buffer 715 are interpreted by the data path & ECC configuration control module 716 to (1) retrieved the data parts 710, 711, and up to 712 from the location 709, (2) configure the corresponding ECC computation modules 114 to perform ECC encode operations, in parallel, on the respective data parts, so that a given ECC byte is computed for each given data part, and finally (3) to store the data parts and the computed ECC bytes (of the data parts) in the appropriate locations in the storage media devices 708. In other words, the ECC modules 114a, 114d, and 114g perform respective ECC encode operations on the data parts 710, 711, and 712, respectively, in a distributed manner and/or a parallel manner. The details on the data flow to the ECC computation modules 114 that will perform ECC encode operations were earlier discussed and illustrated in FIG. 5.

In FIG. 7, the data flow arrow 717 shows the path of the data part 710 being transferred from the local system memory 703 to a storage media device 704a belonging to the storage media device group 718. The data flow arrow 719 shows the path of the data part 711 being transferred from the local system memory 703 to a storage media device 704g belonging to the storage media device group 720. The data flow arrow 721 shows the path of the data part 712 being transferred from the local system memory 703 to a storage media device 704s belonging to the storage media device group 722. The rest of the data parts stored (cached) in the location 709 are also transferred to different groups in the storage media devices 708 in the same manner as discussed above. Additionally, in the same manner, the example data parts 760, 761, and up to 762 that are stored (cached) in the location 706 in memory 703 will be similarly transferred to the storage media devices 708. The dots 753 indicate that the number of data parts 760-762 in location 706 may vary. Therefore, the data parts 710-712 and 760-762 are distributed among different groups 718, 720, and 722 in the storage media devices 708 and different ECC computation engines perform distributed ECC computations (distributed ECC encoding in this write operation) of the data parts 710-712 and 760-762. Each given ECC computation engine handles the ECC computation for a given group in the storage media that will store a given data part.

Figure 8:
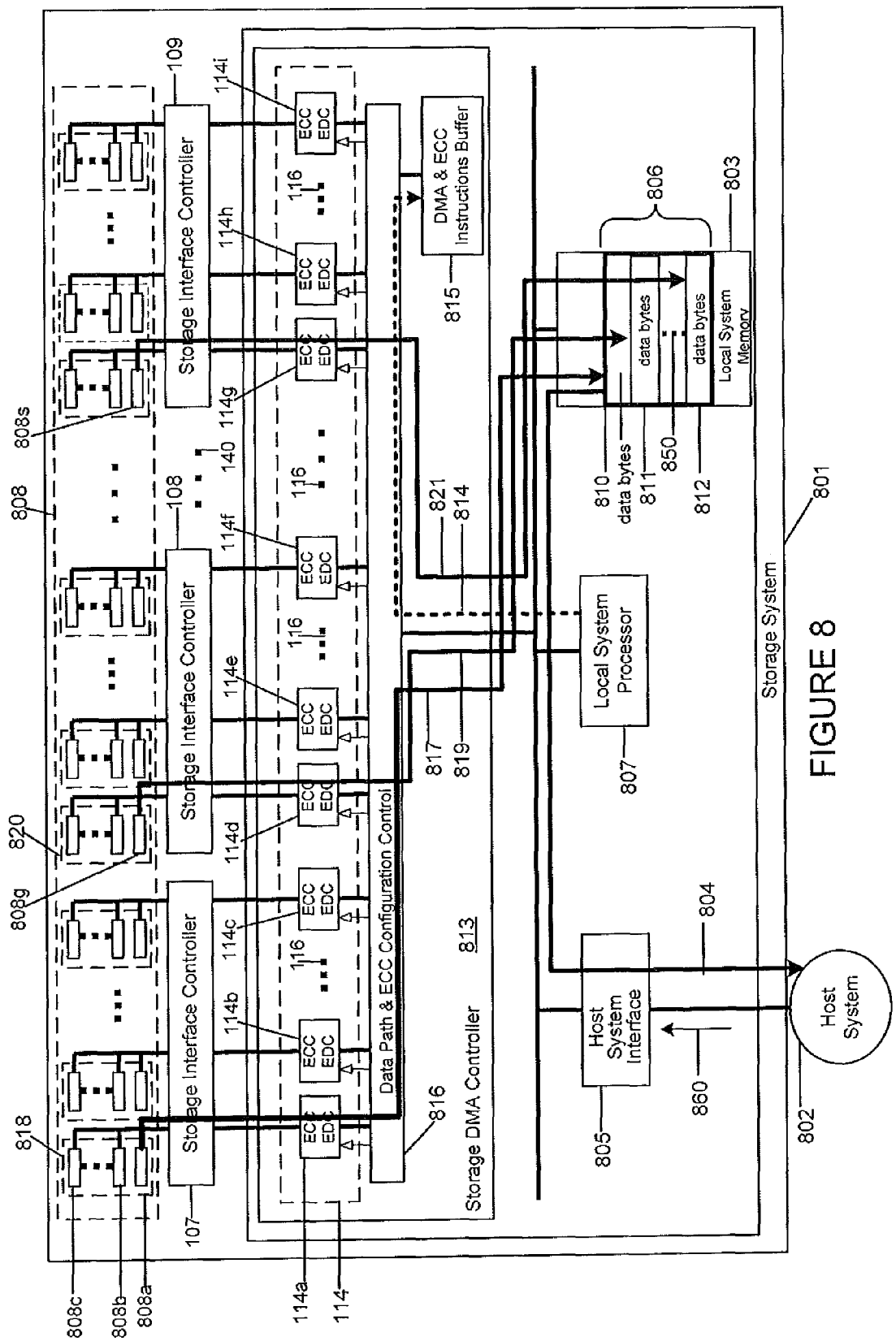
FIG. 8 is a block diagram of a data flow when servicing a typical read command from the host system to the storage system, in accordance with an embodiment of the invention.

FIG. 8 is a block diagram of a data flow when servicing a typical read command 860 from the host system 802 to the storage system 801, in accordance with an embodiment of the invention. The system 801 uses a first embodiment of the invention as an example illustration of the data flow. However, this data flow in FIG. 8 may be applicable in other embodiments of the invention, since various embodiments of the invention vary only in the placement of the ECC computation modules. The components in FIG. 8 have also been described above in the similar or the same components in the other drawings. In the shown example scenario, the storage system 801 is responding to a READ command from the connected host system 802. The local system memory 803 is provided as a data cache for the data transmitted from the devices 808 to the host system 802. The local system memory 803 is typically implemented by a volatile random access memory such as, e.g., SRAM or DRAM, or by another suitable device. Hence, data can be transmitted faster to the host system 802 if the data were to be retrieved from the local system memory 803 instead of retrieving the data from the non-volatile storage media devices 808.

The example in FIG. 8 shows the scenario when the read data is not yet cached in the local system memory 803 and will have to be retrieved from their locations in the storage media devices 808. Since the storage system 801 employs data protection using ECC, the local system processor 807 will have to set the ECC computation configuration parameters 404 for any data that will be retrieved from the storage media devices 808 by the storage DMA controller 813. Since the storage system 801 has distributed ECC capability, the bottleneck of ECC bytes decoding and ECC error detection and/or ECC correction is advantageously eliminated by partitioning the data and then using different ECC computation modules 114a-114i for each data part to be read from the devices 808.

After reading the data from the devices 808, the data is to be cached in the location 806 before transmitting the data to the host system 802 that issued the READ command. The data in the location 806 (of local system memory 803) is formed by data parts 810, 811, and up to 812, with each data part stored in (and retrieved from) a different respective media storage group in devices 808. The dots 850 indicate that the number of data parts 810-812 may vary in a location (e.g., location 806).

The local system processor 807 controls the storage DMA controller 813 using DMA instructions 450. As earlier discussed and illustrated in FIG. 4, such DMA instructions 450 contain DMA information 403 and also ECC configuration information 404. The dashed line arrow 814 illustrates the path of the DMA instructions 450 from the local system processor 807 to the DMA & ECC instructions buffer 815 which will store the DMA instructions 450. The DMA instructions 450 in the buffer 815 are interpreted by the data path & ECC configuration module 816 so that the module 816 can (1) retrieve the data parts 810, 811, and up to 812 from their respective locations in different groups 818, 820, and 822 in the storage media devices 808, (2) configure the corresponding respective ECC computation modules 114a, 114d, and 114g to perform a respective ECC error detect operation (and, if required based on the ECC configuration information 404, perform a respective ECC error correction) on the respective data parts 810-812, and finally (3) store the data parts 810-812 in the appropriate location 806 in the local system memory 803. In other words, the ECC modules 114a, 114d, and 114g perform respective ECC error detect operations (or respective ECC error detect and ECC error correct operations) on the data parts 810, 811, and 812, respectively, in a distributed manner and/or a parallel manner. The details on the data flow to the ECC computation modules 114 were earlier discussed and illustrated in FIG. 6.

In FIG. 8, the data flow arrow 817 shows the path of the data part 810 being transferred from a storage media device 808a belonging to the storage media device group 818 to the location 806 in the local system memory 803. The data flow arrow 819 shows the path of the data part 811 being transferred from a storage media device 808g belonging to the storage media device group 820 to the location 806 in the local system memory 803. The data flow arrow 821 shows the path of the data part 812 being transferred from a storage media device 808s belonging to the storage media device group 822 to the location 806 in the local system memory 803. The rest of the data parts of the data to be stored in the location 806 are transferred from different groups in the devices 808 to the memory 803 in the same manner as discussed above.

Once cached in the memory 803, a data in location 806 can then be sent by the interface 805 to the host system 802. In FIG. 8, the data flow arrow 804 shows the path of the read data from the location 806 to the host system 802. The host system interface controller 805 retrieves the cached data in the local system memory 803 and then sends that data to the host system 802. The local system processor 807 configures the host system interface controller 805 to perform this described operation of sending cached data from the memory 803 to the host system 802 that issued a READ request to the storage system 801.

In the first two embodiments in FIGS. 1 and 2, respectively, the possible ECC computations (namely, ECC encode, ECC detect, and ECC correct operations) can be performed by each ECC EDC module. If the ECC EDC module were to be implemented as an ASIC core, then the logic for all three operations will be embedded in each core.

Figure 9:
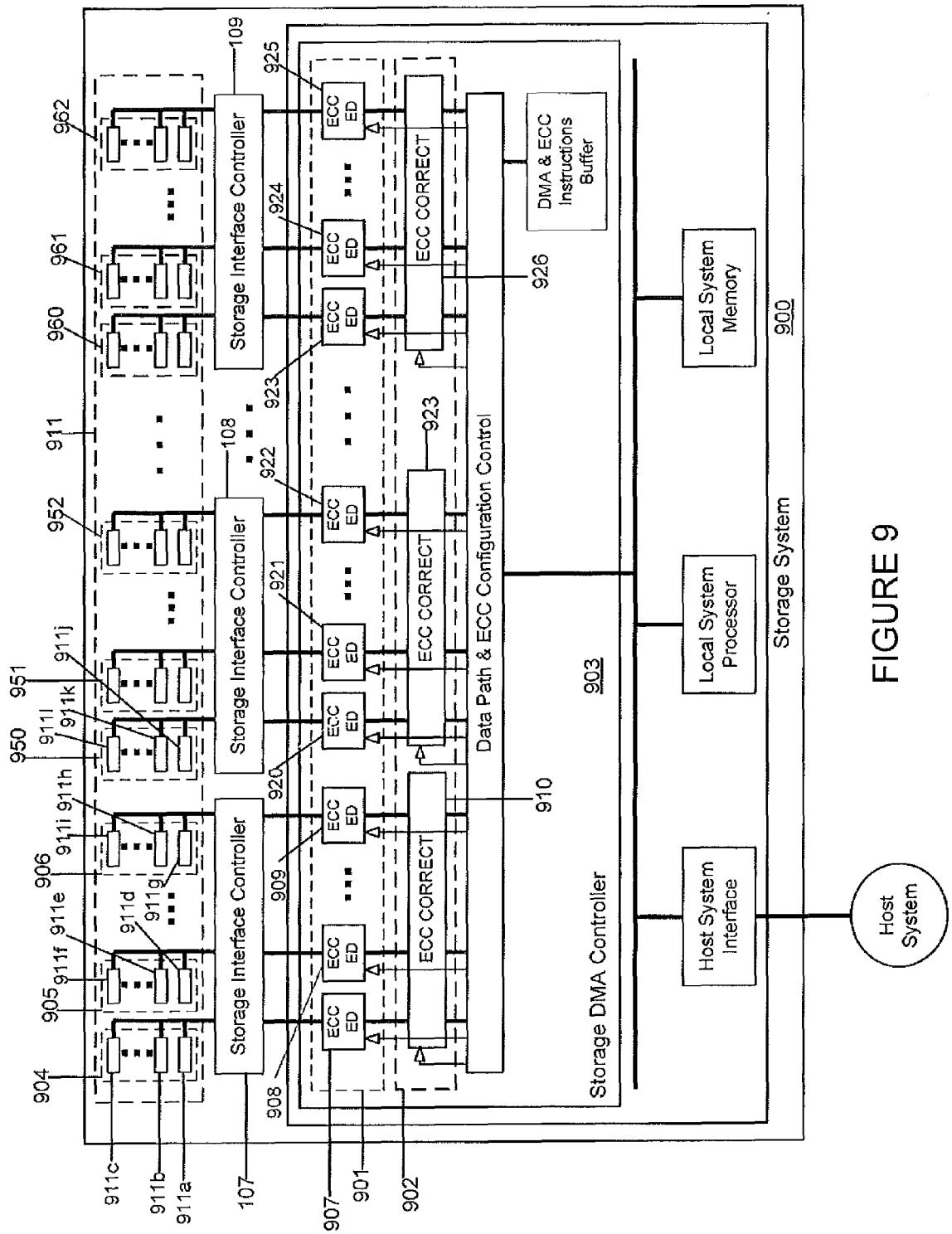
FIG. 9 is a block diagram of a storage system in accordance with another embodiment of the invention, wherein the storage system provides a lower cost embodiment and wherein the ECC encode and ECC error detect capability of the DMA controller is decoupled from the ECC error correct capability.
Figure 10:
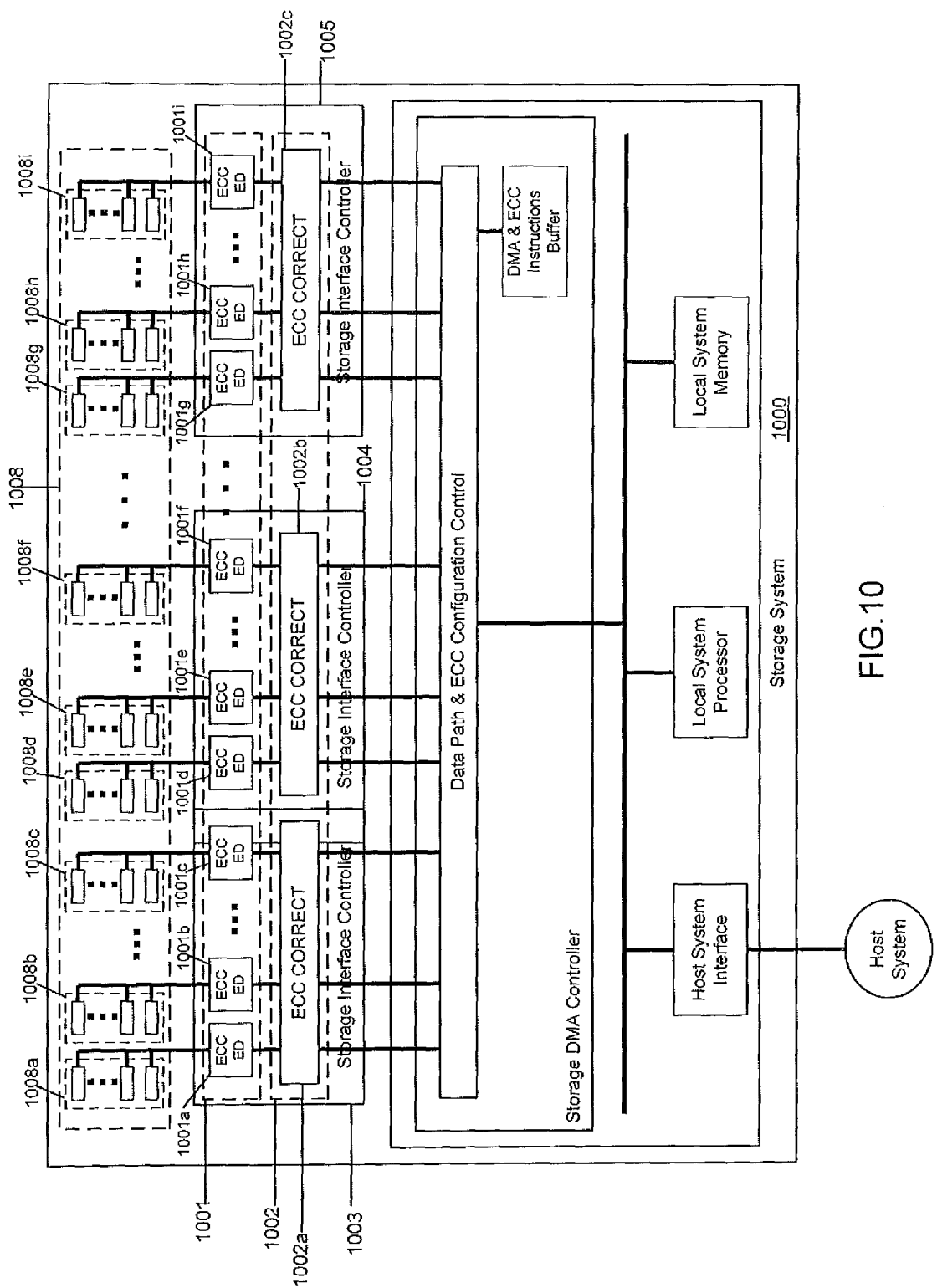
FIG. 10 is a block diagram of a storage system in accordance with yet another embodiment of the invention, wherein the storage system provides a lower cost embodiment and wherein the ECC encode and ECC error detect capability is also decoupled from the ECC error correct capability and wherein such capabilities are incorporated into the storage interface controller.
Figure 11:
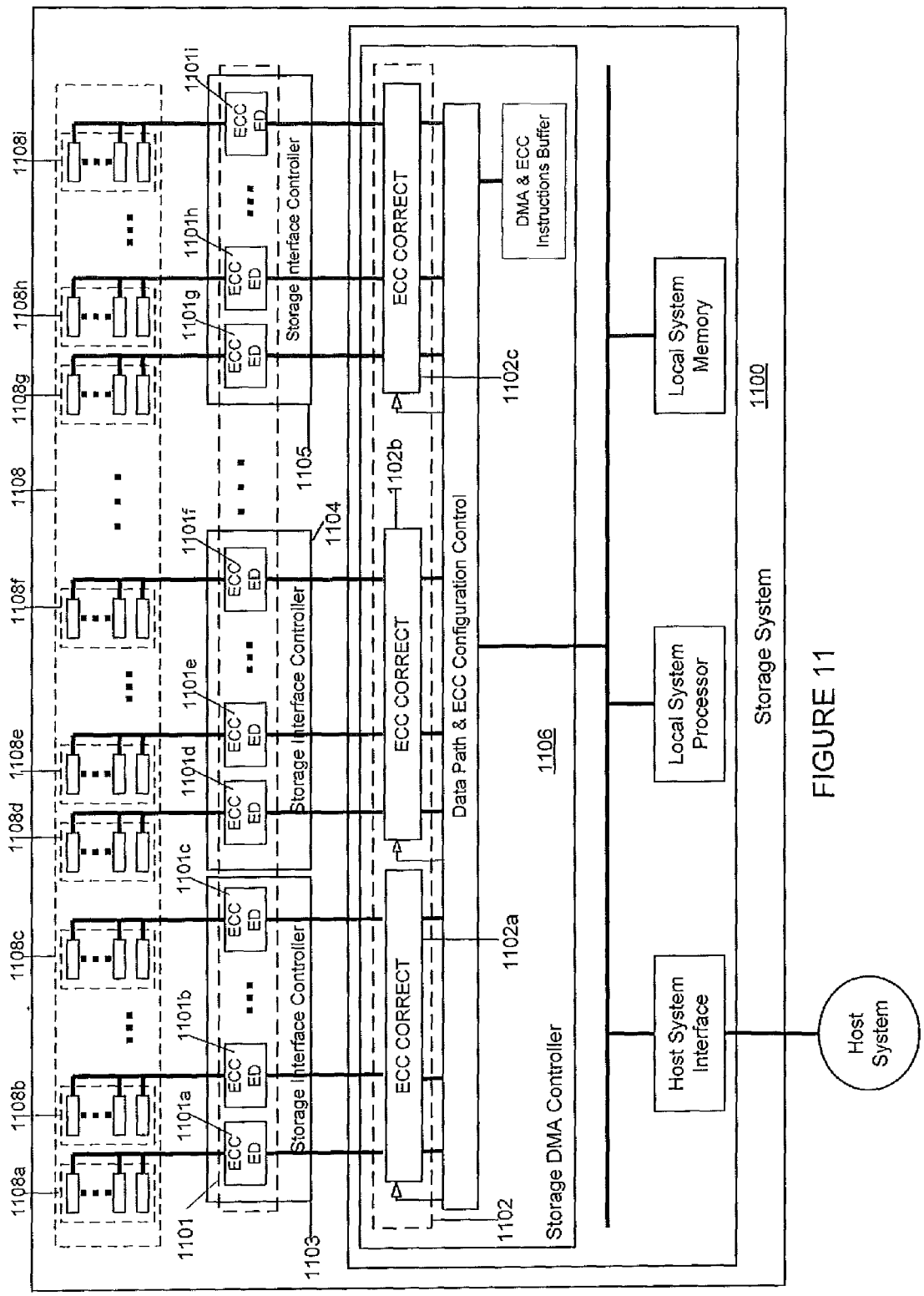
FIG. 11 is a block diagram of a storage system in accordance with a further embodiment of the invention, wherein the storage system provides a lower cost embodiment and wherein the ECC encode and ECC error detect capability is incorporated into the storage interface controller and decoupled from the ECC error correct capability which is incorporated into the storage DMA controller.

Three more alternative embodiments are presented as lower-cost options in the storage systems 900, 1000, and 1100 in FIGS. 9, 10, and 11, respectively. In these embodiments, the ECC correction operation is decoupled from the ECC encode and detect operations because an ECC correction module is a separate component from the ECC Encode and ECC Detect module. An ECC Correct module will perform the correction for the data passing through a plurality of ECC Encode and ECC Detect modules (i.e., "ECC ED modules" 901 and 1001). The ECC ED modules will typically require less logic than the previously described ECC EDC module, but the ECC Correct module that will perform the corrections will have to be shared among a plurality of ECC ED modules, as will be discussed below. This should typically be an adequate implementation for most applications since the ECC correct operation is expected to be performed at fewer occurrences than the ECC encode and ECC detect operations. The ECC correction will be performed when there are detected errors on the data.

FIG. 9 is a block diagram of a storage system 900 in accordance with another embodiment of the invention, wherein the storage system 900 provides a lower cost embodiment and wherein the ECC encode and error detect capability of the DMA controller 903 is decoupled from the ECC error correct capability. In this third embodiment of the invention, the data and the computed ECC bytes for that data will pass through one of the given storage interface controllers 107-109 to the destination storage media devices 911, and an ECC Correct module is shared by all data that are passing through to that given storage interface controller. The ECC ED modules 907, 908, 909, 920, and up to 925 and ECC correct modules 910, 923, and up to 926 are located in the storage DMA controller 903.

The ECC ED modules 907-909 and ECC Correct module 910 are referred herein as a first plurality of ECC engines. The ECC ED modules 920-922 and ECC Correct module 923 are referred herein as a second plurality of ECC engines. The ECC ED modules 923-925 and ECC Correct module 926 are referred herein as a third plurality of ECC engines.

This third embodiment of the invention differs from the first embodiment (shown in FIG. 1) and the second embodiment (shown in FIG. 2) since the storage system 900 uses the ECC Encode and Detect modules 901 in the storage DMA controller 903 instead of the previously described ECC EDC modules 114 or 201 (FIGS. 1 and 2, respectively). The ECC ED modules 901 require fewer logic when compared to the ECC EDC modules since the ECC ED modules 901 do not contain logic for performing ECC error correction. Specifically, each of the ECC Encode and Detect modules 901 perform only the ECC encode and ECC detect operations. Hence, this third embodiment of the invention is considered a lower cost alternative to the first two embodiments.

In this embodiment of the invention, the logic for performing ECC error correction is included (or implemented) in a different module called ECC correct module 902 in the storage DMA controller 903. Each ECC correct module 902 is shared by multiple ECC ED modules 901. Thus, data from multiple storage media groups (in storage media devices 911) will still be routed to separate particular ECC ED modules 907-909 via controller 107, but this data will also be routed to a same given ECC correct module 910 (associated with those particular ECC ED modules 907-909) if an error is detected by any of those particular ECC ED modules 907-909 in the data.

In this embodiment of the invention, the ECC ED modules 901 and the ECC correct modules 902 are placed (included or integrated) in the storage DMA controller 903. As an example illustrated in FIG. 9, data from the storage media devices 911a, 911b, and up to 911c in the storage media group 904 (of storage media devices 911) is routed to the ECC ED module 907. Data from the storage media devices 911d, 911e, and up to 911f in the storage media group 905 is routed to the ECC ED module 908. Data from the storage media devices 911g, 911h, and up to 911i in the storage media group 906 is routed to the ECC ED module 909. If any of the ECC ED modules 907, 908, or 909 detects an ECC error on the data during the ECC detect mode operation, then the ECC Correct module 910 (associated with the particular ECC ED modules 907-909) will handle the ECC error correction for the data. If ECC errors are simultaneously detected by more than one of the particular ECC ED modules 907, 908, and 909, then the ECC ED correction module 910 will operate on the data from each module 907, 908, and 909 (e.g., one at the time) for ECC error correction on the data. Therefore, a given multiple ECC ED modules 907-909 are distributed to and associated with (and share) a single given ECC correct module 910 where the module 910 will perform ECC error corrections on data with ECC errors detected by any of the modules 907-909. This configuration in FIG. 9 may potentially present a performance tradeoff in exchange for achieving the lower implementation cost due to a lesser number of ECC Correct logic.

In the embodiment of FIG. 9, the storage interface controller 108 is coupled to the groups 950, 951, and up to 952. Data from the storage media groups 950, 951, and up to 952 is routed to EDD ED modules 920, 921, and up to 922 via controller 108. If any of the ECC ED modules 920-922 detects an ECC error on the data during the ECC detect mode operation, then the ECC Correct module 923 (associated with the particular ECC ED modules 920-922) will handle the ECC error correction for the data.

Similarly, the storage interface controller 109 is coupled to the groups 960, 961, and up to 962. Data from the storage media groups 960, 961, and up to 962 is routed to EDD ED modules 923, 924, and up to 925 via controller 109. If any of the ECC ED modules 923-925 detects an ECC error on the data during the ECC detect mode operation, then the ECC Correct module 926 (associated with the particular ECC ED modules 923-925) will handle the ECC error correction for the data.

Depending on the application, the cost in the storage system 900 can further be lowered by further reducing the number of ECC correct modules 902 and arranging the remaining ECC correct modules 902 to handle data correction for data from additional or more storage device groups. This would involve, for example, connecting one or more additional storage device groups to the storage interface controller 107 which transmits data that can be ECC error corrected by the ECC Correct module 910 or other suitable arrangements.

FIG. 10 is a block diagram of a storage system 1000 in accordance with yet another embodiment of the invention, wherein the storage system 1000 provides a lower cost embodiment and wherein the ECC encode and error detect capability is also decoupled from the ECC error correct capability and wherein such capabilities are incorporated into the storage interface controllers. In this fourth embodiment of the invention, the ECC ED modules 1001 and the ECC correct modules 1002 are located in the storage interface controllers 1003, 1004, and up to 1005. This embodiment of the invention differs only from the third embodiment of FIG. 9 in terms of the placement of the ECC ED modules 1001 and ECC correct modules 1002, and are distributed to the storage interface controllers 1003, 1004, and up to 1005.

Specifically, the storage interface controller 1003 is coupled to the groups 1008a, 1008b, and up to 1008c in storage media devices 1008. Data from the storage media groups 1008a, 1008b, and up to 1008c is routed to the EDD ED modules 1001a, 1001b, and up to 1001c that are distributed in the storage interface controller 1003. If any of the ECC ED modules 1001a-1001c detects an ECC error on the data during the ECC detect mode operation, then the ECC Correct module 1002a (associated with the particular ECC ED modules 1001a-1001c and included in the controller 1003) will handle the ECC error correction for the data.

Similarly, the storage interface controller 1004 is coupled to the groups 1008d, 1008e, and up to 1008f in storage media devices 1008. Data from the storage media groups 1008d, 1008e, and up to 1008f is routed to EDD ED modules 1001d, 1001e, and up to 1001f that are distributed in the storage interface controller 1004. If any of the ECC ED modules 1001d-1001f detects an ECC error on the data during the ECC detect mode operation, then the ECC Correct module 1002b (associated with the particular ECC ED modules 1001d-1001f and included in the controller 1004) will handle the ECC error correction for the data.

Similarly, the storage interface controller 1005 is coupled to the groups 1008g, 1008h, and up to 1008i in storage media devices 1008. Data from the storage media groups 1008g, 1008h, and up to 1008i is routed to EDD ED modules 1001g, 1001h, and up to 1001i that are distributed in the storage interface controller 1005. If any of the ECC ED modules 1001g-1001i detects an ECC error on the data during the ECC detect mode operation, then the ECC Correct module 1002c (associated with the particular ECC ED modules 1001g-1001i and included in the controller 1005) will handle the ECC error correction for the data.

The ECC ED modules 1001a-1001c and ECC Correct module 1002a are referred herein as a first plurality of ECC engines. The ECC ED modules 1001d-1001f and ECC Correct module 1002b are referred herein as a second plurality of ECC engines. The ECC ED modules 1001g-1001i and ECC Correct module 1002c are referred herein as a third plurality of ECC engines. The modules 1001a-1001c is a subset of modules 1001.

FIG. 11 is a block diagram of a storage system 1100 in accordance with a further embodiment of the invention, wherein the storage system 1100 provides a lower cost embodiment and wherein the ECC encode and error detect capability is incorporated into the storage interface controller and decoupled from the ECC error correct capability which is incorporated into the storage DMA controller 1106. In this fifth embodiment of the invention, the ECC ED modules 1101 are located in (or included with) the storage interface controllers 1103, 1104, and up to 1105 while the ECC correct modules 1102 are located in (or included with) the storage DMA controller 1106. This embodiment of the invention differs only from the third embodiment of FIG. 9 in terms of the placement of the ECC ED modules 1001 and ECC correct modules 1102. In FIG. 11, the ECC ED modules 1101 are distributed to (and placed in) the storage interface controllers 1103, 1104, and up to 1105, but the ECC correct modules 1102 are distributed to (and placed in) the storage DMA controller 1106. The controller 1106 is separate from the controllers 1103-1105.

Specifically, the storage interface controller 1103 is coupled to the groups 1108a, 1108b, and up to 1108c in storage media devices 1108. Data from the storage media groups 1108a, 1108b, and up to 1108c is routed to EDD ED modules 1101a, 1101b, and up to 1101c that are distributed in the storage interface controller 1103. If any of the ECC ED modules 1101a-1101c detects an ECC error on the data during the ECC detect mode operation, then the ECC Correct module 1102a (associated with the particular ECC ED modules 1101a-1101c and included in the storage DMA controller 1106) will handle the ECC error correction for the data.

Similarly, the storage interface controller 1104 is coupled to the groups 1108d, 1108e, and up to 1108f in storage media devices 1108. Data from the storage media groups 1108d, 1108e, and up to 1108f is routed to EDD ED modules 1101d, 1101e, and up to 1101f that are distributed in the storage interface controller 1104. If any of the ECC ED modules 1101d-1101f detects an ECC error on the data during the ECC detect mode operation, then the ECC Correct module 1102b (associated with the particular ECC ED modules 1101d-1101f and included in the storage DMA controller 1106) will handle the ECC error correction for the data.

Similarly, the storage interface controller 1105 is coupled to the groups 1108g, 1108h, and up to 1108i in storage media devices 1108. Data from the storage media groups 1108g, 1108h, and up to 1108i is routed to EDD ED modules 1101g, 1101h, and up to 1101i that are distributed in the storage interface controller 1105. If any of the ECC ED modules 11019-1101i detects an ECC error on the data during the ECC detect mode operation, then the ECC Correct module 1102c (associated with the particular ECC ED modules 1101g-1101i and included in the storage DMA controller 1006) will handle the ECC error correction for the data.

The ECC ED modules 1101a-1101c and ECC Correct module 1102a are referred herein as a first plurality of ECC engines. The ECC ED modules 1101d-1101f and ECC Correct module 1102b are referred herein as a second plurality of ECC engines. The ECC ED modules 1101g-1101i and ECC Correct module 1102c are referred herein as a third plurality of ECC engines. The modules 1101a-1101c is a subset of the modules 1101.

In the third, fourth, and fifth embodiments of the invention as shown in FIGS. 9, 10, and 11, respectively, the ECC encode and detect operations are distributed to several engines or one DCC ED module for each storage media device group. The ECC correct module is shared and used for performing the ECC error correction on the data from different storage media groups.

When the ECC EDC module or ECC ED module is in the Encode mode, there are a number of ECC encoding configurations that result in varying combinations of number of code words per data unit, number of detectable errors per code word, number of correctable errors per code word, and number of ECC bytes per code word. The configurations are selected such that the additional storage bytes allocated per data unit will be sufficient for the resulting ECC bytes and any other information (e.g., metadata) that is required to accompany a data part (data unit).

The same ECC encoding configuration 404 is required to use the ECC EDC module or ECC ED module in the ECC detect mode, or ECC detect and ECC correct mode.

An additional configuration during ECC error detection is a bit selecting either the ECC detect mode 415 or the ECC detect and correct mode 416. If the setting indicates the ECC detect mode 415 only, then a software interrupt will be asserted if there is an ECC error detected. Typically, a storage system management software 350 running in the local system processor 106 will handle the ECC error. If the setting indicates the ECC detect and correct mode 416, the ECC EDC module will correct any detected correctable error. Also, in this case and if using the ECC ED module, the ECC ED module will arbitrate for usage of the shared ECC Correct module to correct any detected correctable error. A software interrupt will typically be asserted for correctable errors.

Note that some storage system applications may have particular data integrity requirements, and a storage system may be employed as an individual component in a RAID array. However, the conventional approaches teaches away from (and discourages) performing any non-RAID type error corrections since the RAID array provides a replica of the data, and the replica may typically be retrieved from another storage component or the RAID parity may be used to reconstruct the correct data.

Figure 12:
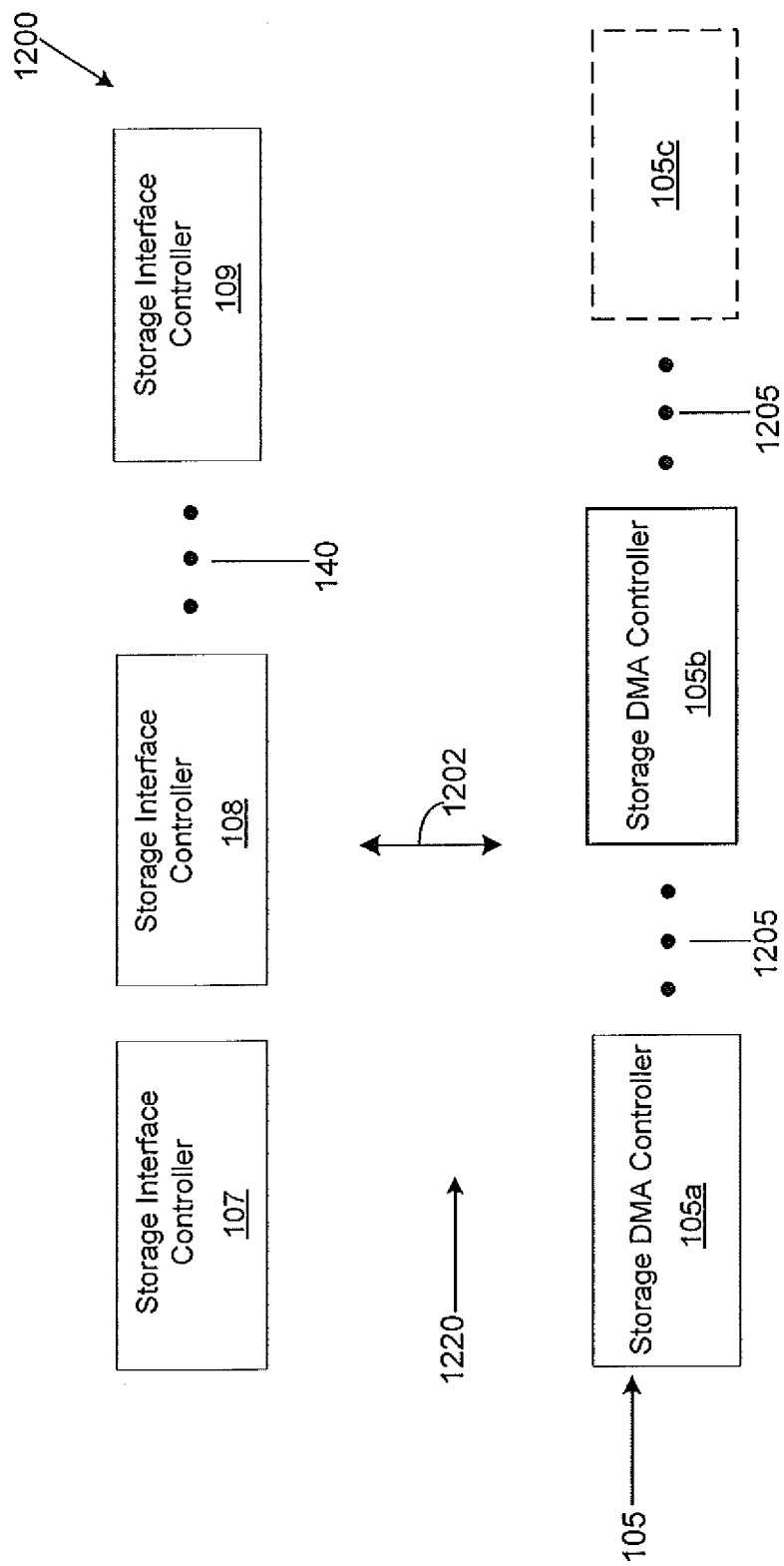
FIG. 12 is a block diagram illustrating a configuration for use in a storage system that is scaled to achieve improved performance, in accordance with an embodiment of the invention.

FIG. 12 is a block diagram illustrating a configuration 1200 for use in a storage system that is scaled to achieve improved performance, in accordance with an embodiment of the invention. For example, the storage system 101 (and/or other embodiments of a storage system shown in other drawings) may be scaled to achieve improved performance (e.g., increased speed) or may be scaled to achieve decreased size and/or decreased cost. In order to scale a storage system 101 for achieving improved performance, a plurality (or an increased number) of storage DMA controllers 105 (e.g., controllers 105a up to 105b) may be coupled (via connection 1202) to a given plurality of storage interface controllers 107, 108, and up to 109 in a chip set 1220. The dots 1205 indicate that the number of storage DMA controllers 105 may vary (i.e., the controllers 105 may be formed by the two storage DMA controllers 105a and 105b, or the controllers 105 may be formed by the controllers 105a and 105b and one or more additional storage DMA controllers such as the storage DMA controller 105c shown in the dashed-line box 105c).

As one example, the increased number (or the plurality) of storage DMA controllers 105 (e.g., controllers 105a and 105b) coupled to a given number of storage interface controllers 107-109 achieves improved performance for a storage system (e.g., system 101). In contrast, in FIG. 1, only one storage DMA controller 105 is coupled to a given number of storage interface controllers 107-109.

As another simplified example, each of the storage interface controllers 107, 108, and 109 can be connected to a different storage DMA controller 105a, 105b, and 105c, and so this example would include three different storage DMA controllers 105 in system 101 in order to achieve improved performance.

Figure 13:
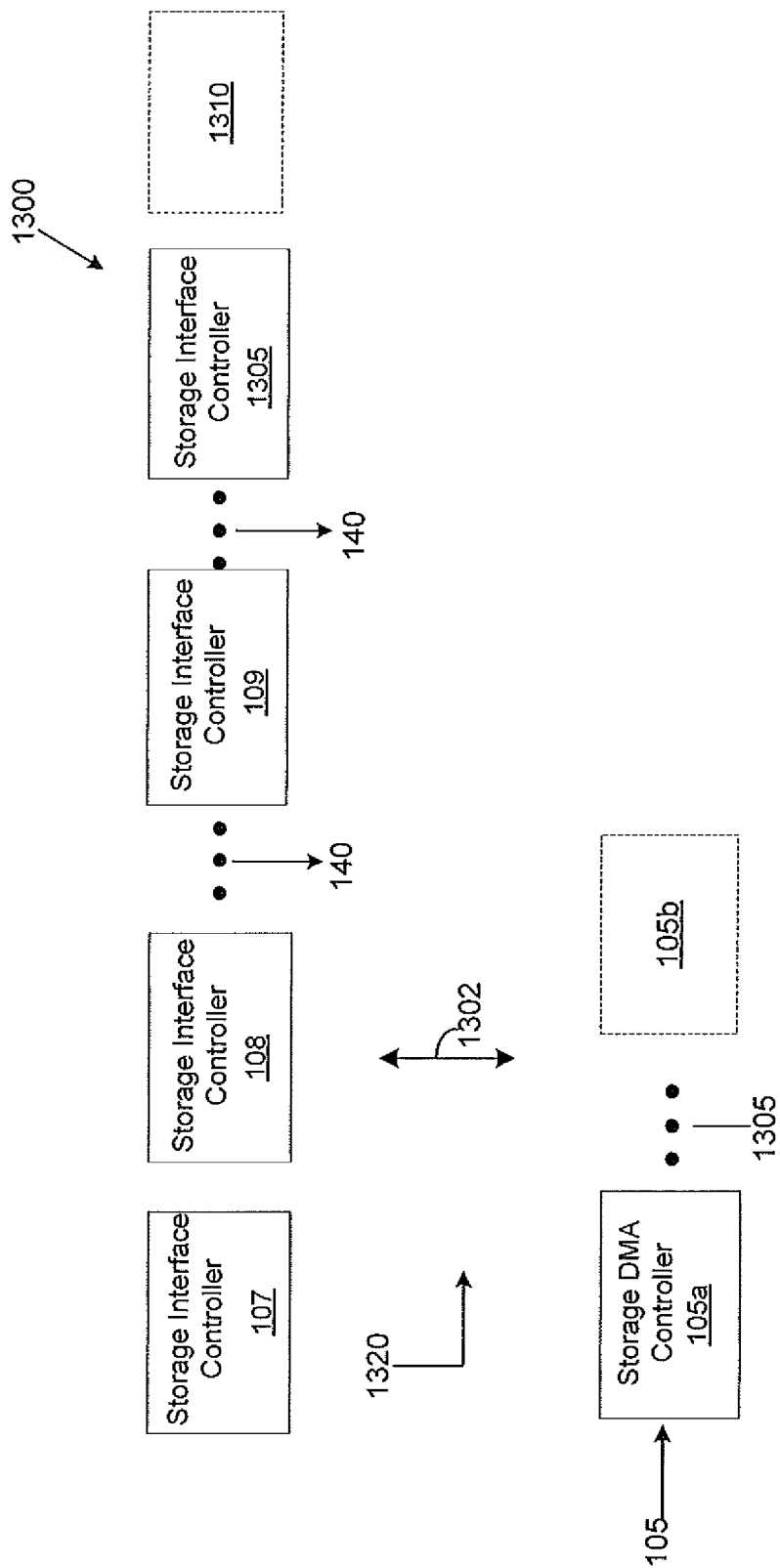
FIG. 13 is a block diagram illustrating a configuration for use in a storage system that is scaled to achieve decreased size and/or decreased cost, in accordance with an embodiment of the invention.

FIG. 13 is a block diagram illustrating a configuration 1300 for use in a storage system that is scaled to achieve decreased size and/or decreased cost, in accordance with an embodiment of the invention. In order to scale a storage system 101 (or other storage systems disclosed herein) for achieving decreased size and/or decreased cost, a storage DMA controller 105a (or a given plurality of storage DMA controllers such as 105a and 105b with the dots 1305 indicating that the number of storage DMA controllers 105 may vary) may be coupled (via connection 1302) to a given plurality of storage interface controllers 107, 108, and up to 109 and one or more additional storage interface controllers 1305. As a simplified example, increasing the number of storage interface controllers in addition to the present controllers 107, 108, and 109, and connecting this increased plurality of storage interface controllers 107-109 and 1305 to the storage DMA controller 105a, in a chip set 1320, would achieve a decreased sized and/or decreased cost device that can be used with the storage system 101.

Therefore, in one example, an increased number (or increased plurality) of storage interface controllers 107-109 and 1305 may be connected to a given single storage DMA controller 105a, or may instead be connected to a given plurality of storage DMA controllers 105 (e.g., controllers 105a and 105b), in order to achieve a decreased size and/or decreased cost device. In another example, an increased number (or increased plurality) of storage interface controllers 107-109 and 1305 and additional one or more storage interface controllers 1310 (shown in dashed-line box 1310) may be connected to a given single storage DMA controller 105a or to a given plurality of storage DMA controllers 105 (e.g., controllers 105a and 105b), in order to achieve a decreased size and/or decreased cost device.

Figure 14:
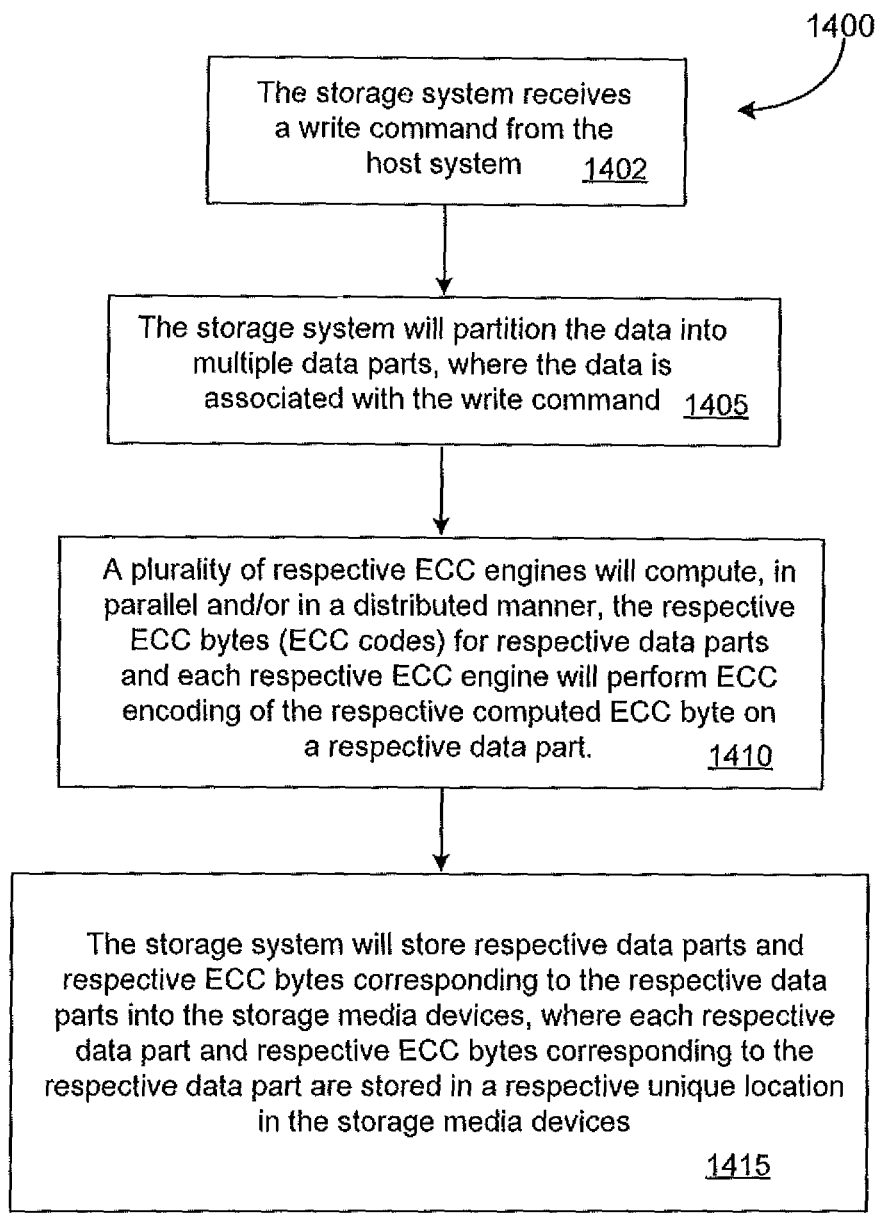
FIG. 14 is a flow diagram of a method of servicing a write command from a host system connected to a storage system, in accordance with an embodiment of the invention.

FIG. 14 is a flow diagram of a method 1400 of servicing a write command from a host system connected to a storage system, in accordance with an embodiment of the invention. In block 1402, the storage system receives a write command from the host system. In block 1405, the storage system will partition the data into multiple data parts, where the data is associated with the write command.

In block 1410, a plurality of respective ECC engines will compute, in parallel and/or in a distributed manner, the respective ECC bytes (ECC codes) for respective data parts and each respective ECC engine will perform ECC encoding of the respective computed ECC byte on a respective data part.

In block 1415, the storage system will store respective data parts and respective ECC bytes corresponding to the respective data parts into the storage media devices, where each respective data part and respective ECC bytes corresponding to the respective data part are stored in a respective unique location in the storage media devices.

Figure 15:
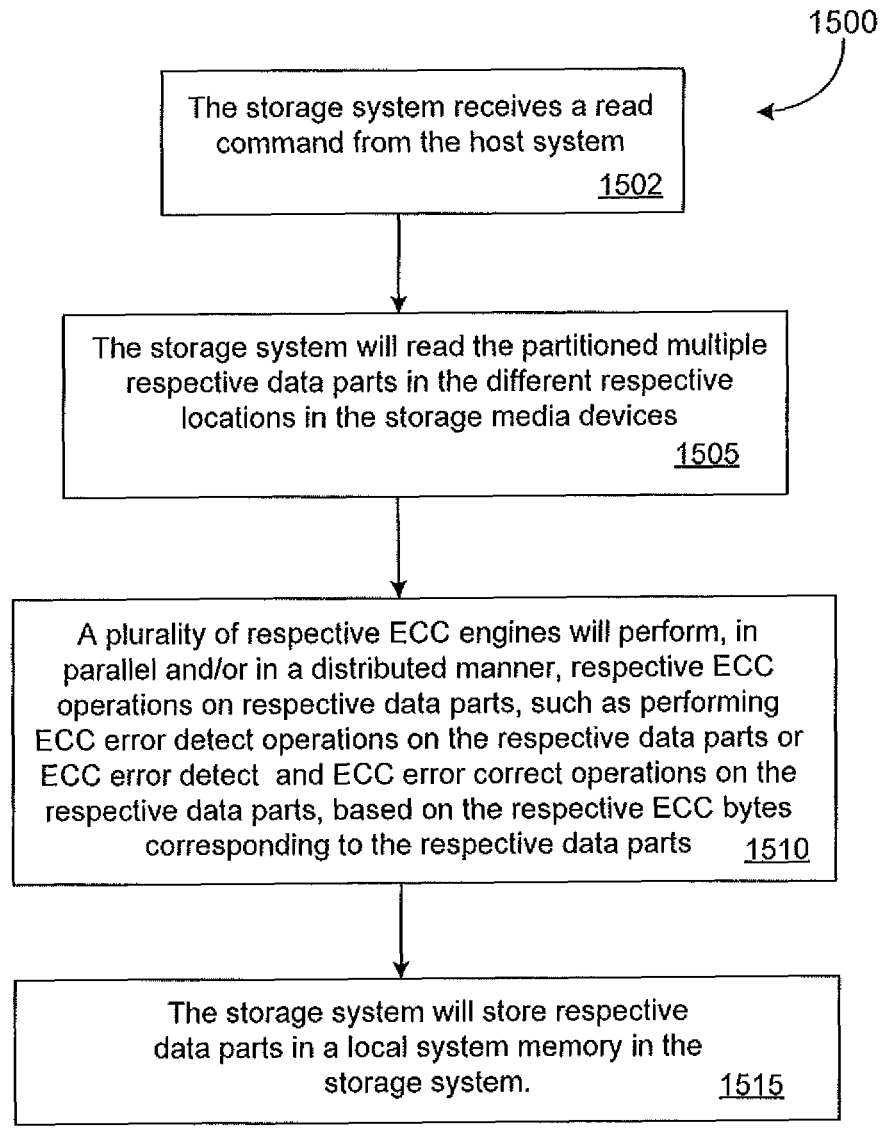
FIG. 15 is a flow diagram of a method of servicing a read command from a host system connected to a storage system, in accordance with an embodiment of the invention.

FIG. 15 is a flow diagram of a method 1500 of serving a read command from a host system connected to a storage system, in accordance with an embodiment of the invention. In block 1502, the storage system receives a read command from the host system. In block 1505, the storage system will read the partitioned multiple respective data parts in the different respective locations in the storage media devices.

In block 1510, a plurality of respective ECC engines will perform, in parallel and/or in a distributed manner, respective ECC operations on respective data parts, such as performing a ECC error detect operation on the respective data parts or ECC error detect and ECC error correct operations on the respective data parts, based on the respective ECC bytes corresponding to the respective data parts.

In block 1515, the storage system will store respective data parts (or the multiple data parts) in a local system memory in the storage system.

In summary, one or more embodiments of the invention may advantageously increase the speed of data transfers in electronic disks (or other storage media devices) that use, for example, flash devices. As discussed above, in one or more embodiments of the invention, the ECC computation is decentralized. In one or more embodiments of the invention, the ECC computation is moved relatively closer to the storage media devices (e.g., flash devices). As also discussed above, in one embodiment of the invention, an ECC module is dedicated to function with an associated group of storage media devices, where each group of storage media devices includes an N number of storage media devices (e.g., flash devices) and N is a suitable integer depending on the implementation of a storage system that includes an embodiment of the invention.

In an embodiment of the invention where an ECC module is dedicated to function with an associated group of storage media devices, the conventional requirement to place data in a queue to a centralized ECC block is advantageously eliminated. As a result, this embodiment of the invention can advantageously remove the data bottleneck problem of conventional systems and can thus increase the speed of data transfer in a storage system.

It is also within the scope of the present invention to implement a program or code that can be stored in a machine-readable or computer-readable medium to permit a computer to perform any of the inventive techniques described above, or a program or code that can be stored in an article of manufacture that includes a computer readable medium on which computer-readable instructions for carrying out embodiments of the inventive techniques are stored. Other variations and modifications of the above-described embodiments and methods are possible in light of the teaching discussed herein.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

We claim:

1. An apparatus for handling distributed error correction code (ECC) operations, the apparatus comprising:
    a plurality of ECC engines configured to perform ECC operations in parallel on multiple data parts that are partitioned from a contiguous data;
    the plurality of ECC engines distributed in parallel to receive some of the multiple data parts that are read from storage media devices and to receive some of the other multiple data parts that are to be written to the storage media devices;
    the plurality of ECC engines configured to use respective computed ECC parts corresponding to respective ones of the multiple data parts;
    wherein the plurality of ECC engines comprises a first ECC engine and a second ECC engine;
    wherein the storage media devices comprises: a first group comprising a first plurality of storage media devices and a second group comprising a second plurality of storage media devices;
    a first storage interface controller coupled to the first ECC engine and to the first group;
    wherein the first storage interface is coupled between the first ECC engine and the first group;
    wherein the first storage interface comprises first logic to provide access to and directly control each of the first plurality of storage devices in the first group and to provide a first path between the first plurality of storage devices and the first ECC engine for the first data part and first computed ECC part; and
    a second storage interface controller coupled to the second ECC engine and to the second group;
    wherein the second storage interface is coupled between the second ECC engine and the second group;
    wherein the second storage interface comprises second logic to provide access to and directly control each of the second plurality of storage devices in the second group and to provide a second path between the second plurality of storage devices and the second ECC engine for the second data part and second computed ECC part;
    a processor configured to partition the contiguous data into the multiple data parts;
    wherein the multiple data parts comprises a first data part and a second data part;
    wherein, in parallel, the first ECC engine performs an ECC operation on the first data part including computing a first computed ECC part and the second ECC engine performs another ECC operation on the second data part including computing a second computed ECC part; and
    a storage direct memory access (DMA) controller coupled to the processor and to the first and second storage interface controllers;
    wherein the storage DMA controller is configured to write or read the first data part and the first computed ECC part in a first storage media device in the first group;
    wherein the storage DMA controller is configured to write or read the second data part and the second computed ECC part in another storage media device in the second group.

2. The apparatus of claim 1, wherein the ECC engines are included in the storage DMA (direct memory access) controller.

3. The apparatus of claim 2, wherein the storage DMA controller includes a DMA & ECC instruction buffer configured to store DMA instructions for use in DMA operations and ECC configurations for use in ECC operations.

4. The apparatus of claim 2, wherein the storage DMA controller includes a data path & ECC configuration control block configured to permit DMA operations with distributed ECC.

5. The apparatus of claim 1, wherein the ECC engines are used with a storage system.

6. The apparatus of claim 5, wherein the storage system includes a local memory system.

7. The apparatus of claim 5, wherein the storage system includes a host system interface configured to receive requests from a host system.

8. The apparatus of claim 5, wherein the storage system includes a local memory system configured to store the multiple data parts that are read from the storage media devices.

9. The apparatus of claim 5, wherein the storage system includes a local memory system configured to store the multiple data parts that are to be written to the storage media devices.

10. The apparatus of claim 1, wherein the multiple data parts are written to different locations in the storage media devices.

11. The apparatus of claim 10, wherein the different locations comprises different groups in the storage media devices.

12. The apparatus of claim 1, wherein the multiple data parts are read from different locations in the storage media devices.

13. The apparatus of claim 12, wherein the different locations comprises different groups in the storage media devices.

14. The apparatus of claim 1, wherein the plurality of ECC engines has a respective ECC engine that performs an ECC operation on a respective data part in the multiple data parts.

15. The apparatus of claim 1, wherein an ECC operation comprises an ECC encode operation.

16. The apparatus of claim 1, wherein an ECC operation comprises an ECC detect operation.

17. The apparatus of claim 1, wherein an ECC operation comprises an ECC correct operation.

18. The apparatus of claim 1, wherein the storage media devices are coupled to the storage interface controllers.

19. The apparatus of claim 18, wherein the ECC engines are included in the storage interface controllers.

20. The apparatus of claim 1, wherein the ECC engines comprise a plurality of ECC encode and detect modules and a plurality of ECC correct modules, wherein a given subset of the plurality of ECC encode and detect modules is coupled to and is sharing a given ECC correct module of the plurality of ECC correct modules.

21. The apparatus of claim 20, wherein the ECC engines are included in the storage DMA controller.

22. The apparatus of claim 20, wherein the plurality of ECC encode and detect modules are included in the storage interface controllers and the plurality of ECC correct modules are included in the storage DMA controller.

23. The apparatus of claim 1, wherein the ECC engines are included in the storage interface controllers.

24. The apparatus of claim 1, wherein an ECC engine will compute a respective computed ECC part for a respective data part.

25. The apparatus of claim 1, wherein a number of storage interface controllers coupled to the storage media devices and a number of storage DMA controllers can be configured to achieve at least one of an improved performance, decrease size, and decreased cost.

26. The apparatus of claim 1, wherein the storage media devices comprise non-volatile memory devices.

27. The apparatus of claim 1, wherein the first storage interface controller is in a first chip and the second storage interface controller is in a second chip.

28. A method for handling distributed error correction code (ECC) operations, the method comprising:
partitioning a contiguous data into multiple data parts;
wherein the multiple data parts comprises a first data part and a second data part;
performing ECC operations in parallel on the multiple data parts, comprising: in parallel, performing an ECC operation on a first data part including computing a first computed ECC part and performing another ECC operation on a second data part including computing a second computed ECC part; and
the performing ECC operations including using respective computed ECC parts corresponding to respective ones of the multiple data parts;
writing or reading the first data part and the first computed ECC part in a first storage media device in a first group comprising a first plurality of storage media devices;
writing or reading the second data part and the second computed ECC part in another storage media device in a second group in a second plurality of storage media devices;
wherein a first storage interface comprises first logic provide a first path between the first storage media and the first ECC engine for the first data part and first computed ECC part;
wherein a second storage interface comprises second logic to provide a second path between the second storage media and the second ECC engine for the second data part and second computed ECC part.

29. The method of claim 28, wherein the ECC operations is performed in a storage DMA (direct memory access) controller.

30. The method of claim 28, further comprising: storing DMA instructions for use in DMA operations and ECC configurations for use in ECC operations.

31. The method of claim 28, wherein the ECC operation is used with a storage system.

32. The method of claim 28, further comprising: storing the multiple data parts that are read from the storage media devices.

33. The method of claim 28, further comprising: storing the multiple data parts that are to be written to the storage media devices.

34. The method of claim 28, wherein the multiple data parts are written to different locations in the storage media devices.

35. The method of claim 34, wherein the different locations comprises different groups in the storage media devices.

36. The method of claim 28, wherein the multiple data parts are read from different locations in the storage media devices.

37. The method of claim 36, wherein the different locations comprises different groups in the storage media devices.

38. The method of claim 28, wherein the multiple data parts comprises partitions in the contiguous data.

39. The method of claim 28, further comprising: performing an ECC operation on a respective data part in the multiple data parts.

40. The method of claim 28, wherein an ECC operation comprises an ECC encode operation.

41. The method of claim 28, wherein an ECC operation comprises an ECC detect operation.

42. The method of claim 28, wherein an ECC operation comprises an ECC correct operation.

43. The method of claim 28, wherein the ECC operations are performed a plurality of storage interface controllers.

44. The method of claim 28 wherein the ECC operations are performed in a storage DMA controller.

45. The method of claim 28 wherein the ECC operations comprises at least one of ECC error encode, ECC error detect, and ECC error correct; and
wherein the ECC error encode and ECC error detect are performed in a plurality of storage interface controllers and the ECC error correct is performed in a storage DMA controller.

46. The method of claim 28, wherein the storage media devices are coupled to a number of storage interface controllers which are coupled to a number of storage DMA controllers, and wherein the number of storage interface controllers and the number of storage DMA controllers can be configured to achieve at least one of an improved performance, decrease size, and decreased cost.

47. The method of claim 28, wherein the storage media devices comprise non-volatile memory devices.

48. The method of claim 28, wherein the ECC operations are performed in a first storage interface controller in a first chip and in a second storage interface controller in a second chip.

49. An article of manufacture, comprising:
a non-transitory computer-readable medium having stored thereon instructions to:
partitioning a contiguous data into multiple data parts;
wherein the multiple data parts comprises a first data part and a second data part;
perform ECC operations in parallel on the multiple data parts, comprising: in parallel, performing an ECC operation on a first data part including computing a first computed ECC part and performing another ECC operation on a second data part including computing a second computed ECC part; and
the performing ECC operations including use of respective computed ECC parts corresponding to respective ones of the multiple data parts;
write or read the first data part and the first computed ECC part in a first storage media device in a first group comprising a first plurality of storage media devices; and
write or read the second data part and the second computed ECC part in another storage media device in a second group comprising a second plurality of storage media devices;

wherein a first storage interface comprises first logic provide a first path between the first storage media and the first ECC engine for the first data part and first computed ECC part;

wherein the second storage interface comprises second logic to provide a second path between the second storage media and the second ECC engine for the second data part and second computed ECC part.

50. The article of manufacture of claim 49, wherein the ECC operations are performed in a first storage interface controller in a first chip and in a second storage interface controller in a second chip.

\* \* \* \* \*